(12) United States Patent
Uno et al.

(10) Patent No.: US 8,344,459 B2
(45) Date of Patent: Jan. 1, 2013

(54) SEMICONDUCTOR DEVICE

(75) Inventors: Tomoaki Uno, Kanagawa (JP); Masaki Shiraishi, Kanagawa (JP); Nobuyoshi Matsuura, Kanagawa (JP); Yukihiro Satou, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/151,952

(22) Filed: Jun. 2, 2011

(65) Prior Publication Data

US 2011/0227169 A1    Sep. 22, 2011

Related U.S. Application Data

(63) Continuation of application No. 12/247,326, filed on Oct. 8, 2008, now Pat. No. 8,044,468, which is a continuation of application No. 11/030,978, filed on Jan. 10, 2005, now abandoned.

(30) Foreign Application Priority Data

Jan. 16, 2004   (JP) .................................. 2004-008779

(51) Int. Cl.
*H01L 21/331*   (2006.01)

(52) U.S. Cl. ................................. 257/368; 257/E25.031
(58) Field of Classification Search ................... 257/368, 257/E25.031
See application file for complete search history.

(56) References Cited

U.S. PATENT DOCUMENTS

| 4,924,236 A | 5/1990 | Schuss et al. |
| 6,023,178 A | 2/2000 | Shioya et al. |
| 2002/0093094 A1 | 7/2002 | Takagawa et al. |
| 2003/0098468 A1 | 5/2003 | Wheeler et al. |

FOREIGN PATENT DOCUMENTS

| JP | 10-285918 | 10/1998 |
| JP | 2001-25239 | 1/2001 |
| JP | 2002-217416 | 8/2002 |

*Primary Examiner* — Bradley K Smith
*Assistant Examiner* — Amar Movva
(74) *Attorney, Agent, or Firm* — Mattingly & Malur, PC

(57) ABSTRACT

The present invention enhances voltage conversion efficiency of a semiconductor device. In a non-isolated DC-DC converter that includes a high-side switch power MOSFET and a low-side switch power MOSFET, which are series-connected, the high-side switch power MOSFET and driver circuits for driving the high-side and low-side switch power MOSFETs are formed within one semiconductor chip, whereas the low-side switch power MOSFET is formed in another semiconductor chip. The two semiconductor chips are sealed in a single package.

6 Claims, 19 Drawing Sheets

FIG. 7
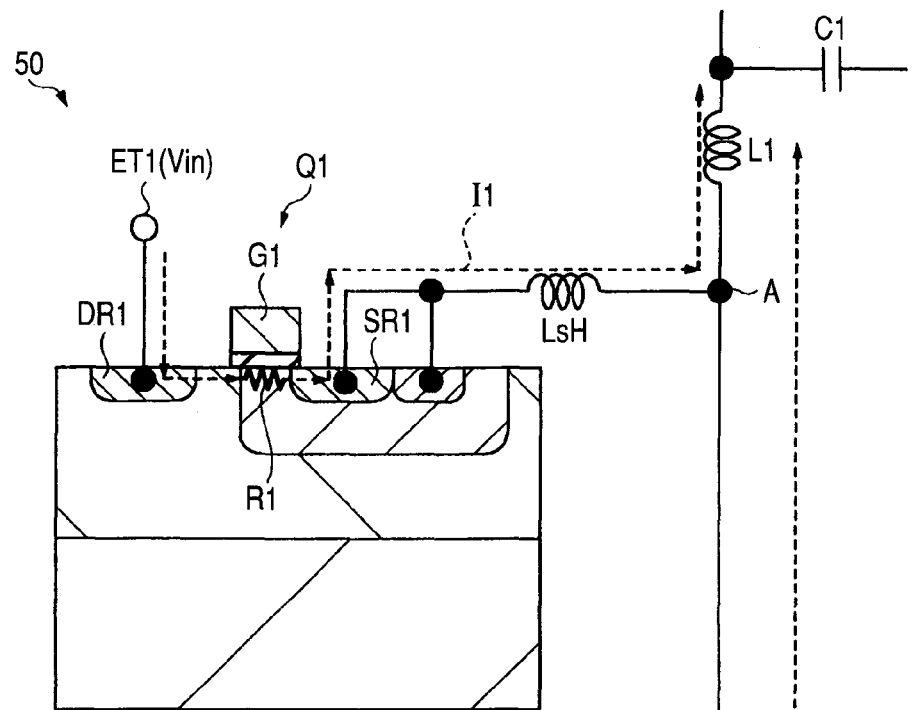
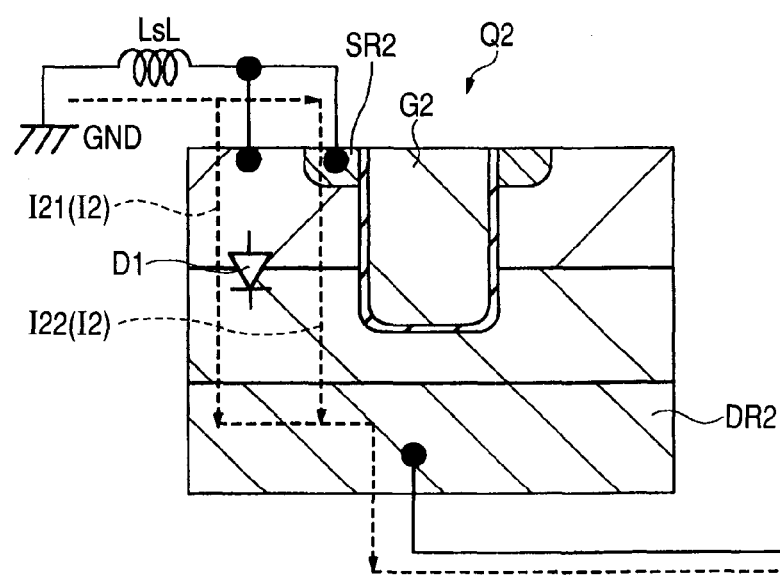

FIG. 13

| SYSTEM PARAMETER | FIG. 9 | FIG. 10 | FIG. 11 | FIG. 12 | FIG. 8 |
|---|---|---|---|---|---|
| WIRING INDUCTANCE | × | ◎ | ○ | ○ | ◎ |
| ON RESISTANCE (LOW-SIDE MOSFET IN PARTICULAR) | ○ | × | ○ | ○ | ○ |
| MINIATURIZATION | × | ◎ | × | ◎ | ◎ |
| HEAT RADIATION | ○ | ×× | △ | × | × |
| OVERALL | × | ○ | ○ | ○ | ◎ |

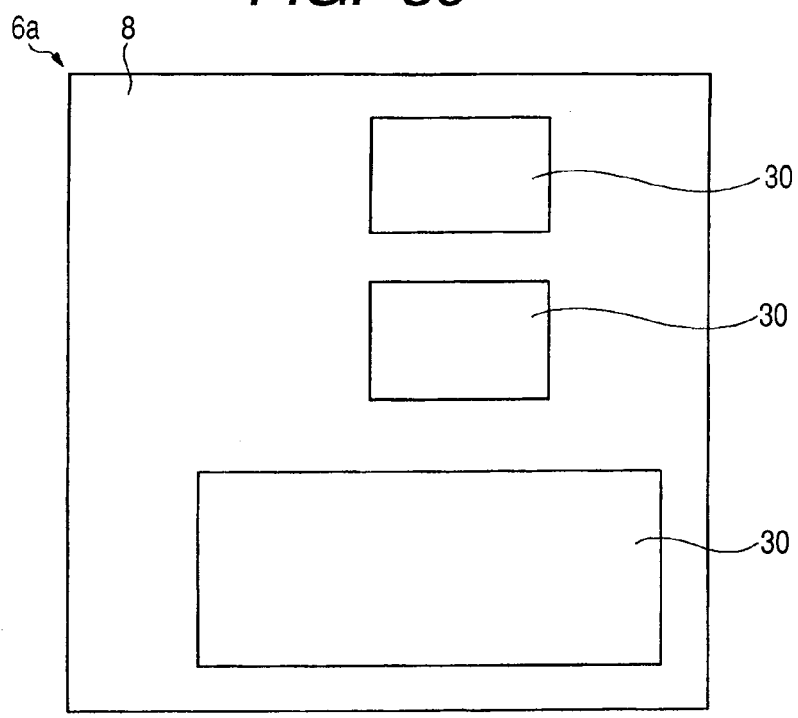
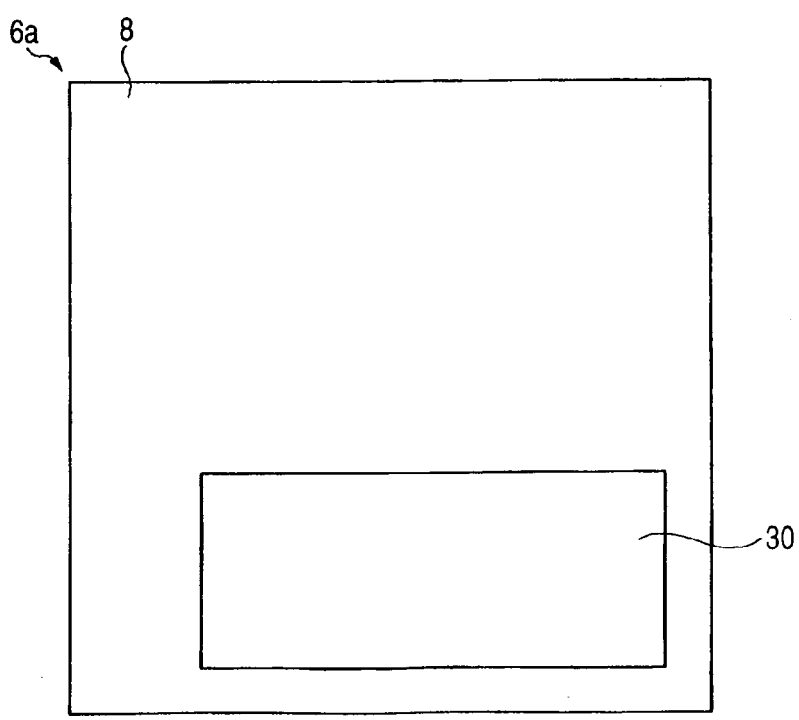

SEMICONDUCTOR DEVICE

This application is a continuation of U.S. application Ser. No. 12/247,326, filed Oct. 8, 2008, now allowed, which is a continuation of U.S. application Ser. No. 11/030,978 filed Jan. 10, 2005, now abandoned, the entirety of which is incorporated herein by reference.

CROSS-REFERENCE TO RELATED APPLICATION

The present application claims priority from Japanese patent application No. 2004-008779 filed on Jan. 16, 2004, the content of which is hereby incorporated by reference into this application.

BACKGROUND OF THE INVENTION

The present invention relates to a semiconductor device technology, and more particularly to a technology that is applicable to a semiconductor device having a power supply circuit.

A DC-DC converter, which is widely used as a power supply circuit, is formed by series-connecting a high-side switch power MOSFET (Metal Oxide Semiconductor Field Effect Transistor) to a low-side switch power MOSFET. The high-side switch power MOSFET has a switch function for DC-DC converter control. The low-side switch power MOSFET has a switch function for synchronous rectification. These two power MOSFETs alternately turn ON/OFF in synchronism with each other to effect power supply voltage conversion.

The DC-DC converter described above is disclosed, for instance, by Japanese Unexamined Patent Publication No. 2002-217416. The technology disclosed by this patent forms a high-side switch with a horizontal power MOSFET and a low-side switch with a vertical power MOSFET.

Further, the technology disclosed, for instance, by Japanese Unexamined Patent Publication No. 2001-25239 uses a resistor and capacitor to reduce noise that is a problem with a DC-DC converter when it is fabricated as a single chip including a control circuit, driver circuit, and power MOSFET.

SUMMARY OF THE INVENTION

However, as regards DC-DC converters that are used as a power supply circuit for a desktop or notebook personal computer, server, game machine, or the like, low-voltage output, large-current output, high-speed response, and miniaturization are demanded in line with a request for the use of a large-current drive CPU (Central Processing Unit) or the like and input/output capacity reduction of a choke coil, which serves as a passive part. To meet such a demand, it is important to devise a method for acquiring a DC-DC converter that permits the use of a large current and high frequency and exhibits high voltage conversion efficiency.

An object of the present invention is to provide a technology for improving the voltage conversion efficiency of a semiconductor device.

Another object of the present invention is to provide a technology for miniaturizing a semiconductor device package.

Still another object of the present invention is to provide a technology for improving the heat radiation capability of a semiconductor device.

The foregoing and other objects and features of the present invention will be apparent from the following, more particular description of the present invention, as illustrated in the accompanying drawings.

A representative aspect of the present invention will now be briefly described.

The present invention is a single semiconductor chip that incorporates a high-side switch power transistor and a drive circuit for driving the high-side switch power transistor.

The advantage provided by a representative aspect of the present invention will now be briefly described.

Since a high-side switch power transistor and a drive circuit for driving the high-side switch power transistor are incorporated into a single semiconductor chip, it is possible to reduce the parasitic wiring inductance, which affects the voltage conversion efficiency to a greater extent than any other wiring path inductance, until it is ignorable. As a result, the present invention improves the voltage conversion efficiency of a semiconductor device.

BRIEF DESCRIPTION OF THE DRAWINGS

FIG. 7 illustrates a device cross-section prevailing during the circuit operation shown in FIG. 6;

FIG. 13 illustrates parameter comparisons of the semiconductor device shown in FIG. 8 and the semiconductor devices shown in FIGS. 9 through 12;

FIG. 30 is a plan view illustrating the upper surface of a package for the semiconductor device shown in FIG. 28; and FIG. 31 is a plan view that illustrates the upper surface of a package for a semiconductor device in order to indicate a typical modified version of FIG. 30.

DESCRIPTION OF THE PREFERRED EMBODIMENTS

Figure 1:
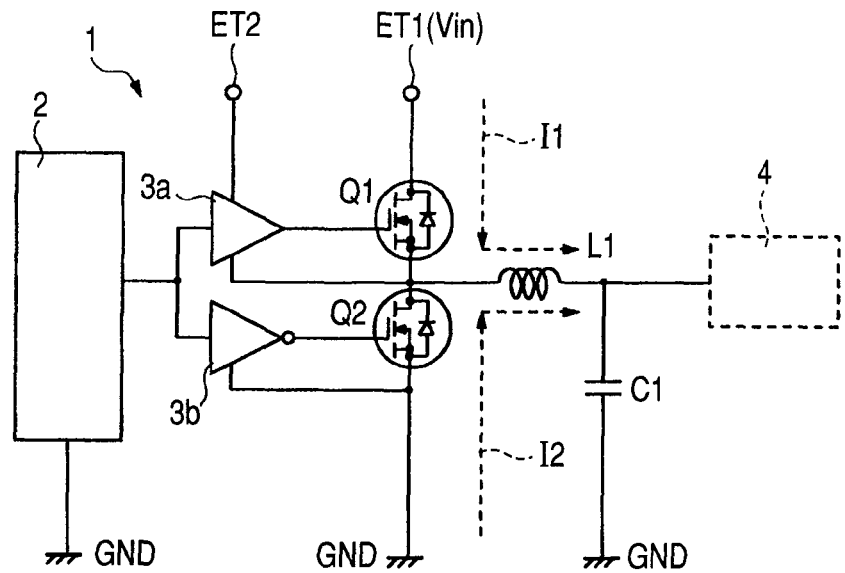
FIG. 1 is a circuit diagram illustrating an example of a semiconductor device according to one embodiment of the present invention.

The embodiments of the present invention will be described while dividing one embodiment into a plurality of sections or a plurality of embodiments if necessary for the sake of convenience. It is noted, however, that they are not irrelevant to one another but one is the modification, detail, additional description of a part of or all of the others unless defined otherwise. Further, in the following embodiments, unless the number of components thereof and the like (including the number, numerical values, quantities, ranges, and the like) are referred to or unless particularly the number of components and the like are designated or obviously specified by the specific numbers, they should not be limited to the specific numbers but may be not less than or not more than the specific numbers. Moreover, it goes without saying that these components (including constituent steps and the like) are not necessarily essential unless they are specially designated or obviously considered to be essential in principle in the following embodiments. Likewise, in the following embodiments, if referring to the shapes, positional relationships, and the like of the components and the like, they include those substantially approximate or similar to the shapes and the like. The same thing is true for the numerical values and ranges thereof stated above. Furthermore, components having the same functions are denoted by the same reference numerals and no repetitive description will be given thereto throughout all the drawings. The embodiments of the present invention will be described below in detail with reference to the accompanying drawings.

First Embodiment

A semiconductor device according to a first embodiment of the present invention is a non-isolated DC-DC converter for use in a power supply circuit that is used, for instance, with a desktop personal computer, notebook personal computer, server, or game machine. FIG. 1 is a circuit diagram that shows an example of a non-isolated DC-DC converter 1. The non-isolated DC-DC converter 1 includes a control circuit 2, driver circuits 3a, 3b, power MOSFET Q1 (first field effect transistor), power MOSFET Q2 (second field effect transistor), a coil L1, and a capacitor C1. These elements are mounted on a wiring substrate and electrically interconnected through wiring on the wiring substrate. The reference numeral 4 in FIG. 1 denotes a CPU (Central Processing Unit), DSP (Digital Signal Processor), or other load circuit for the above mentioned desktop personal computer, notebook personal computer, server, game machine, or the like. The reference numerals ET1 and ET2 denote terminals.

Figure 2:
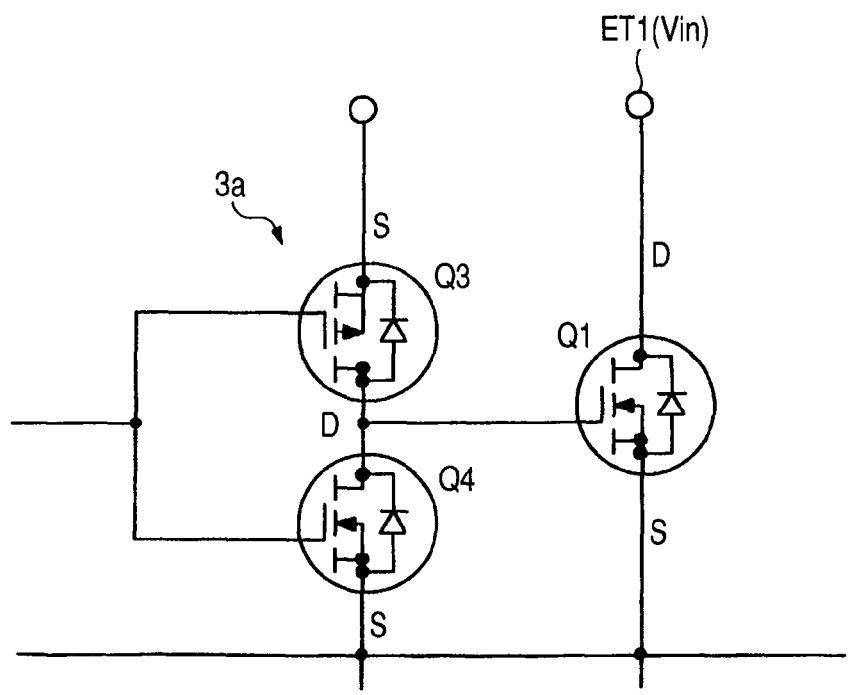
FIG. 2 is a circuit diagram illustrating an example of a drive circuit for the semiconductor device shown in FIG. 1.

The control circuit 2 controls the switch-ON width of power MOSFETs Q1 and Q2. This control circuit 2 is packaged separately from power MOSFETs Q1 and Q2. The output of the control circuit 2 is electrically connected to the inputs of a driver circuit 3a (first control circuit) and a driver circuit 3b (second control circuit). The driver circuits 3a and 3b control the gate electrodes of power MOSFETs Q1 and Q2, respectively. The driver circuits 3a and 3b are formed, for instance, by CMOS inverter circuits. FIG. 2 is a circuit diagram that shows an example of driver circuit 3a. The driver circuit 3a is configured so that a p-channel power MOSFET Q3 and an n-channel power MOSFET Q4 are complementarily series-connected. In FIG. 2, the symbols D and S represent a drain and a source, respectively.

The outputs of driver circuits 3a and 3b are electrically connected to the gate electrodes of power MOSFETs Q1 and Q2, respectively. The power MOSFETs Q1 and Q2 are series-connected between a terminal ET1 (first power supply terminal) to which an input voltage (first power supply potential) Vin is applied and a terminal (second power supply terminal) to which a reference potential (second power supply potential) GND is supplied. For example, the input voltage Vin is approximately 5 to 10 V or approximately 12 V. The reference potential GND is, for instance, a ground potential and approximately 0 (zero) V. The operating frequency (the number of cycles per second at which the power MOSFET Q1/Q2 turns ON/OFF) for the non-isolated DC-DC converter 1 is, for example, 1 MHz or so.

The power MOSFET Q1 is a power transistor for a high-side switch (high potential side: first operating voltage). It has a switch function for storing energy in a coil L1 that supplies power to the output (input of a load circuit 4) of the non-isolated DC-DC converter 1. The power MOSFET Q1 is formed by a horizontal power MOSFET. As regards a high-side switch power MOSFET, it is known that the higher the operating frequency of the non-isolated DC-DC converter 1, the greater the switching loss (turn-ON loss and turn-OFF loss) looks. When a horizontal power MOSFET is used as a high-side switch power MOSFET, the gate region per unit cell area can be rendered smaller than when a vertical power MOSFET is used. Further, the joint area between the gate electrode and drain region drift layer can be reduced. In other words, the switching loss can be reduced because the gate-drain capacity can be decreased. Consequently, when a high-side switch power MOSFET Q1 is formed by a horizontal power MOSFET, the gate-drain capacity can be reduced. As a result, the voltage conversion efficiency can be increased even when the operating frequency of the non-isolated DC-DC converter 1 is high.

The power MOSFET Q2 is a power transistor for a low-side switch (low potential side: second operating voltage). It is a rectification transistor for the non-isolated DC-DC converter 1. It has a function for reducing the transistor resistance and achieving rectification in synchronism with the frequency fed from the control circuit 2. It is formed by a vertical power MOSFET. The reason is that the ON time of the low-side switch power MOSFET Q2 is longer than that of the high-side switch power MOSFET Q1. Therefore, the ON-resistance-induced loss looks greater than the switching loss. However, when a vertical power MOSFET is used, the channel width per unit area is greater than when a horizontal power MOSFET is used. Consequently, the ON resistance can be reduced by the use of a vertical power MOSFET. In other words, when the low-side switch power MOSFET Q2 is formed by a vertical power MOSFET, the ON resistance can be reduced. As a result, the voltage conversion efficiency can be increased even when there is an increase in the current flow to the non-isolated DC-DC converter 1.

Output wiring is electrically connected to the wiring between the source of the power MOSFET Q1 and the drain of the power MOSFET Q2. The output wiring is electrically connected to the coil L1. After the coil L1, the capacitor C1 is electrically connected between the output wiring and the terminal for supplying the reference potential GND. Before the coil L1, a Schottky barrier diode (SBD), which has a lower forward voltage Vf than a parasitic diode D1 for the power MOSFET Q2, may be connected between the output wiring and the terminal for supplying the reference potential GND and in parallel to the power MOSFET Q2. In this instance, the anode of the Schottky barrier diode is electrically connected to the reference potential supply terminal with the cathode electrically connected to the output wiring. This reduces the dead time voltage drop that occurs when the power MOSFET Q2 turns OFF, thereby increasing the speed of the subsequent pulse waveform rise.

Figure 3:
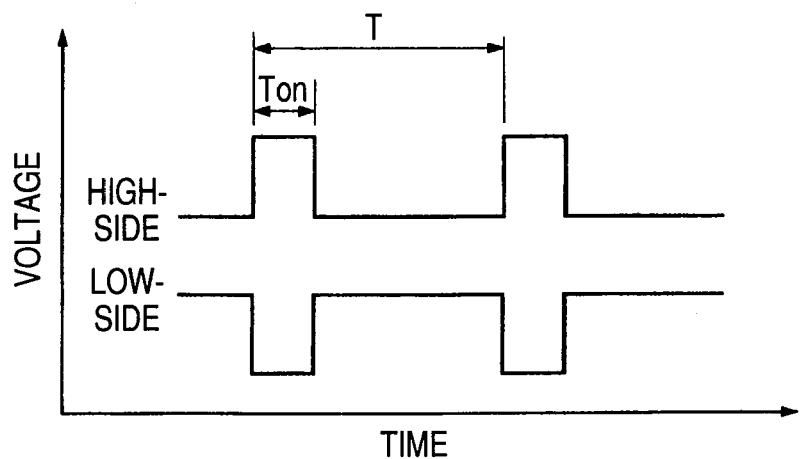
FIG. 3 is a typical timing diagram of the semiconductor device shown in FIG. 1.

In the above circuitry, the power MOSFETs Q1 and Q2 alternately turn ON/OFF in synchronism with each other in order to effect power supply voltage conversion. More specifically, a current I1 (first current) flows when the high-side switch power MOSFET Q1 is ON and a current I2 flows due to the counter electromotive force of the coil L1 when the high-side switch power MOSFET Q1 is OFF. When the low-side switch power MOSFET Q2 is turned ON while the current I2 flows, the voltage drop can be reduced. FIG. 3 is a typical timing diagram of the non-isolated DC-DC converter 1. As mentioned earlier, the ON time of the low-side switch power MOSFET Q2 is longer than that of the high-side switch power MOSFET Q1. The symbol Ton denotes a pulse width prevailing when high-side switch power MOSFET Q1 is ON. The symbol T denotes an interpulse period. The current I1 is a large current, for example, 20 A or so.

In recent years, the drive current for the non-isolated DC-DC converter 1 has increased with an increase in the drive current for the load circuit 4. Further, the operating frequency of the non-isolated DC-DC converter 1 has increased as it is requested that the non-isolated DC-DC converter 1 be miniaturized. Non-isolated DC-DC converter miniaturization is requested because reduction of the overall size of semiconductor devices is requested. In addition, the distance between the non-isolated DC-DC converter 1 and load circuit 4 can be reduced when the non-isolated DC-DC converter 1 is miniaturized, and such distance reduction is ideal for immediately supplying a large current to the load circuit 4. Meanwhile, when the operating frequency of the non-isolated DC-DC converter 1 is increased, it is possible to decrease the number of unit elements for the coil L1 and capacitor C1 and reduce the sizes of the coil L1 and capacitor C1.

Figure 4:
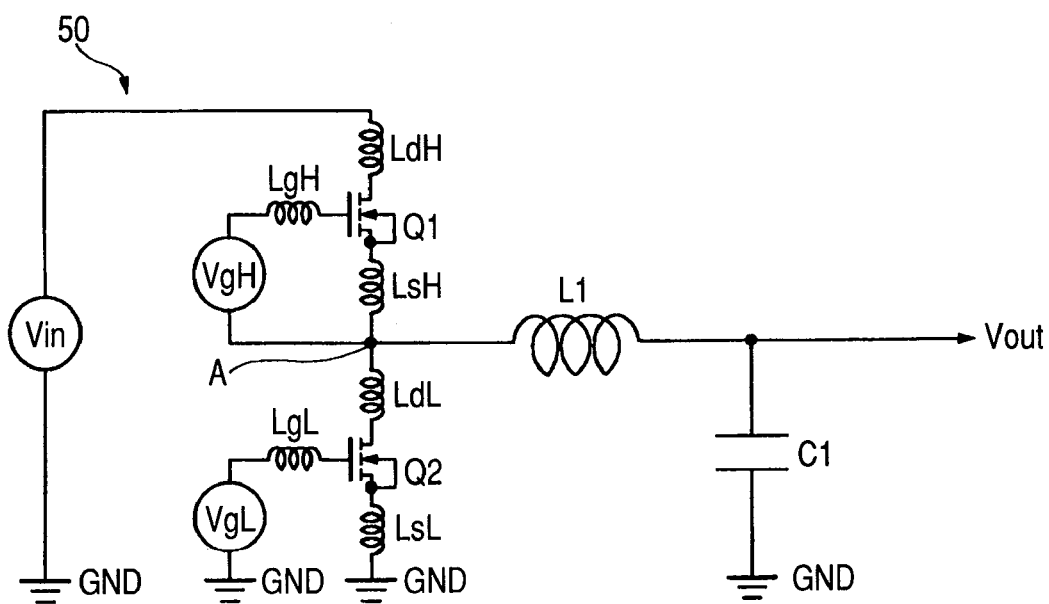
FIG. 4 is an equivalent circuit diagram illustrating inductance components that are parasitic on a semiconductor device according to the present invention.

The inventors of the present invention have found that when the current and frequency are increased as described above, the voltage conversion efficiency of the non-isolated DC-DC converter 50, which is shown in FIG. 4, decreases due to the influence of inductance LsH, which is parasitic on the source side of the high-side switch power MOSFET Q1. FIG. 4 shows an equivalent circuit, which illustrates inductance components that are parasitic on the non-isolated DC-DC converter 50. The symbols LdH, LgH, LsH, LdL, LgL, and LsL denote inductances that are parasitic on the packages of the power MOSFETs Q1 and Q2, printed wiring board wires, and the like. The symbol VgH denotes a gate voltage that is used to turn ON the power MOSFET Q1. The symbol VgL denotes a gate voltage that is used to turn ON the power MOSFET Q2.

Figure 5:
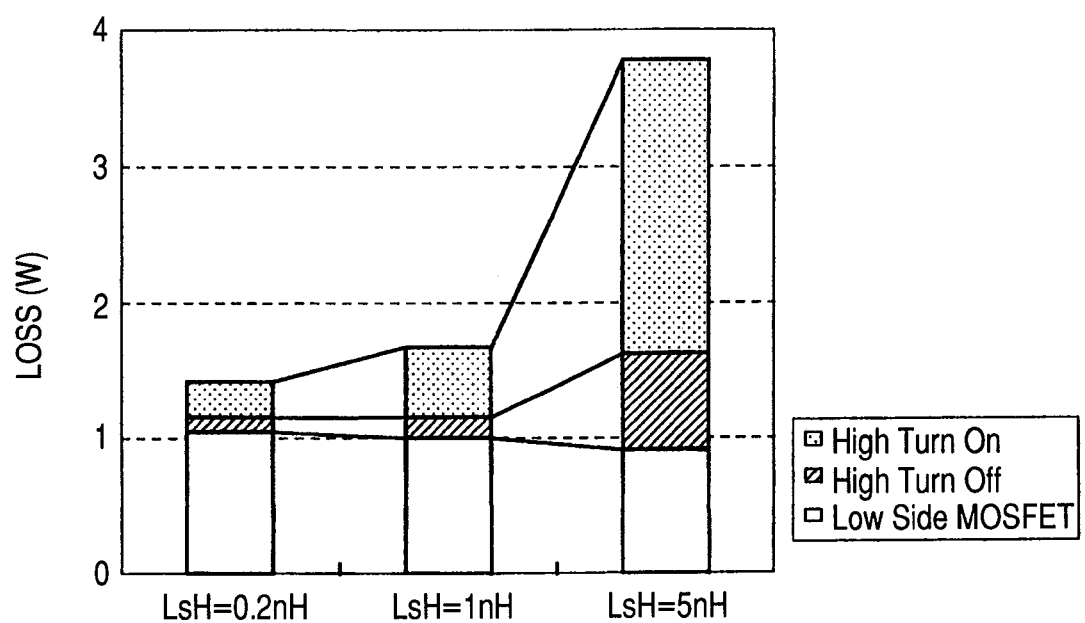
FIG. 5 illustrates the relationship between the loss and inductance components parasitic on a semiconductor device according to the present invention.

FIG. 5 shows the results of a component analysis of inductance LsH and loss. The dotted areas represent the turn-ON loss of the high-side switch power MOSFET. The hatched areas represent the turn-OFF loss of the high-side switch power MOSFET. The unshaded areas represent the loss of the low-side switch power MOSFET. When parasitic inductance LsH increases, the turn-ON loss and turn-OFF loss (turn-ON loss in particular) of the high-side switch power MOSFET Q1 significantly increase, thereby decreasing the voltage conversion efficiency of the non-isolated DC-DC converter 50. The turn-ON loss and turn-OFF loss are proportional to the frequency and output current. Therefore, the loss component increases with an increase in the current and frequency of the non-isolated DC-DC converter 50 as described above.

Figure 6:
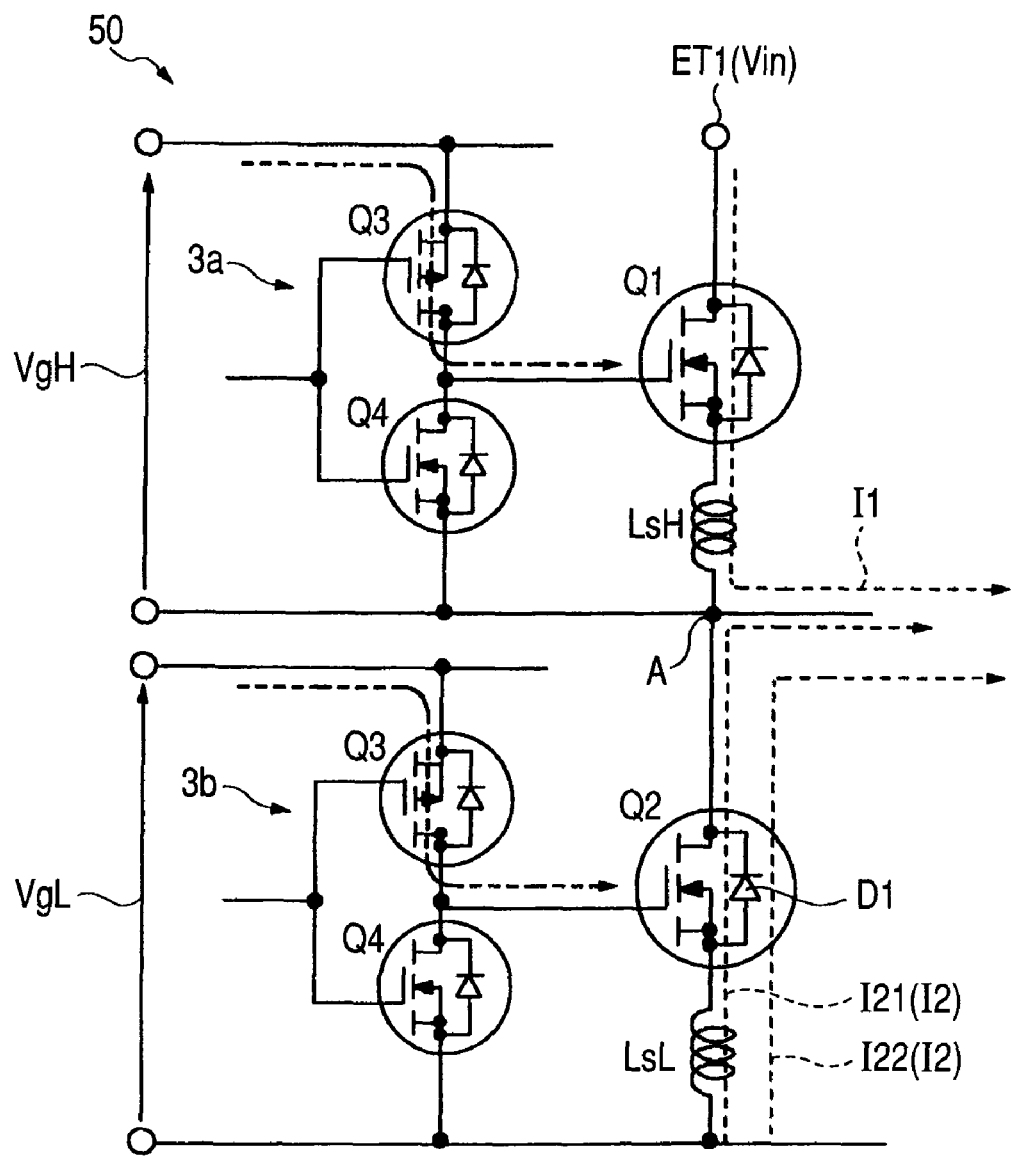
FIG. 6 illustrates a circuit operation of a semiconductor device according to the present invention.

When parasitic inductance LsH increases, the turn-ON and turn-OFF operations delay, thereby increasing the turn-ON loss and turn-OFF loss. The reason for such a phenomenon will now be described. FIG. 6 illustrates a circuit operation of the non-isolated DC-DC converter 50. FIG. 7 illustrates a device cross-section prevailing during a circuit operation.

When the gate voltage of the high-side switch power MOSFET Q1 exceeds a threshold voltage so that the current I1 (first current) begins to flow from the drain region DR1 of the power MOSFET Q1 to the source region SR1, the parasitic inductance LsH gives rise to a counter electromotive force of LsH×di/dt. The source potential of the high-side switch power MOSFET Q1 then becomes higher than at point A shown in FIGS. 6 and 7. The gate voltage of the power MOSFET Q1 is given by a power supply (control circuit 2 in reality) with reference to point A. Therefore, the voltage applied to the gate electrode G1-source region SR1 of the high-side switch power MOSFET Q1 is lower than the gate voltage VgH. The loss of the current I1 then arises because the channel resistance R1 of the high-side switch power MOSFET Q1 does not sufficiently decrease. In other words, the turn-ON time increases. The turn-ON loss and turn-OFF loss increase with an increase in the power and frequency as described earlier because a counter electromotive force (LsH×di/dt) increases due to an increase in the power and frequency.

Meanwhile, the low-side switch power MOSFET Q2 is configured so as not suffer from the above switching loss. When the high-side switch power MOSFET Q1 turns OFF, a current I21 (second current) flows from the reference potential GND to a drain region DR2 of the power MOSFET Q2 via the parasitic diode D1, which is connected in parallel to the low-side switch power MOSFET Q2. When the gate voltage VgH is applied to the gate electrode G2 of the low-side power MOSFET Q2 for turn-ON, a current I22 (third current) flows from the source region SR2 of power MOSFET Q2 to the drain region DR2 via the channel region of power MOSFET Q2. However, the current I21, which is mentioned above, flows prior to the current I22. Further, the electrical current change per unit time is small when the current I22 flows. The counter electromotive force induced by the parasitic inductance LsL is small and ignorable. Therefore, no substantial loss occurs.

Figure 8:
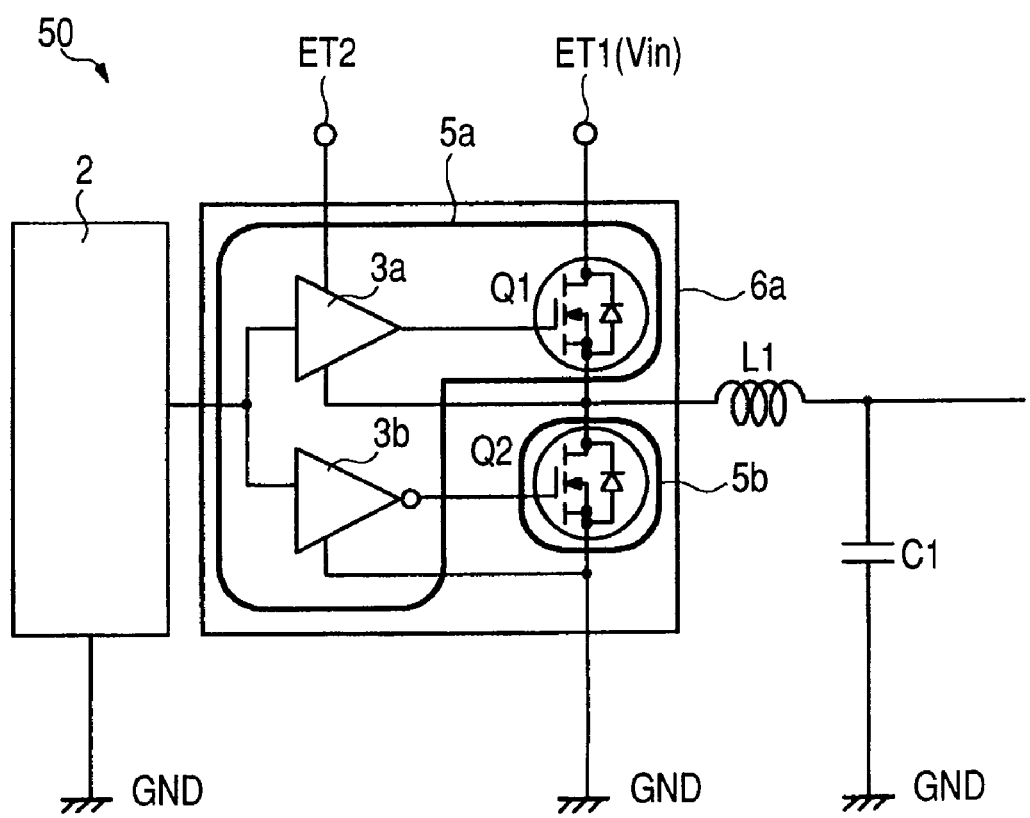
FIG. 8 illustrates a typical configuration of the semiconductor device shown in FIG. 1.

In the first embodiment, the driver circuits 3a and 3b and the high-side switch power MOSFET Q1 are formed into a single semiconductor chip (first semiconductor chip) 5a as shown in FIG. 8 for the main purpose of avoiding a problem in which the voltage conversion efficiency of the non-isolated DC-DC converter decreases due to the influence of the inductance LsH that is parasitic on the source side of the abovementioned high-side switch power MOSFET Q1. Joints made with bonding wires can then be connected with metal wires within the semiconductor chip 5a. Therefore, the parasitic inductance LsH, which affects the voltage conversion efficiency to a greater extent than any other wiring inductance, can be reduced until it is ignorable. Consequently, the switching loss of the high-side switch power MOSFET Q1 (turn-ON loss and turn-OFF loss) can be reduced. As a result, it is possible to increase the voltage conversion efficiency of the non-isolated DC-DC converter 1. For the purpose of reducing the parasitic inductance LsH, the high-side switch driver circuit 3a and power MOSFET Q1 should be formed within the same semiconductor chip 5a. However, the driver circuits 3a and 3b alternately operate in synchronism with each other. From the viewpoint of overall circuit operation stability, it is therefore preferred that the driver circuits 3a and 3b be formed within the same semiconductor chip.

Further, the low-side switch power MOSFET Q2 is formed in another semiconductor chip (second semiconductor chip), and then the semiconductor chips 5a and 5b are encased in a single package 6a made of a resin sealing body. This ensures that the wiring inductance can be reduced. Further, the non-isolated DC-DC converter 1 can be reduced in size. If attention is paid on wiring inductance reduction only, it is preferred that the low-side switch power MOSFET Q2 be formed within the abovementioned semiconductor chip. However, since the high-side switch power MOSFET Q1 is formed by a horizontal power MOSFET while the low-side power MOSFET Q2 is formed by a vertical power MOSFET as described above, it is extremely difficult to form these different types of MOSFETs within the same semiconductor chip. Even if they can be formed within the same semiconductor chip, the production process is complicated so that the production takes a considerable amount of time while increasing the cost. Further, the low-side switch power MOSFET Q2 is likely to generate heat because it has a longer ON time than the high-side switch power MOSFET Q1 as described earlier. Therefore, if the low-side switch power MOSFET Q2 is formed within the same semiconductor chip as for the high-side switch power MOSFET Q1, it is anticipated that the heat generated during the operation of the low-side switch power MOSFET Q2 may adversely affect the high-side switch power MOSFET Q1 through a semiconductor substrate. As such being the case, the first embodiment forms the low-side switch power MOSFET Q2 in the semiconductor chip 5b because the semiconductor chip 5b is separate from the semiconductor chip 5a in which the high-side switch power MOSFET Q1 is formed. This ensures that the production process for the non-isolated DC-DC converter 1 is easier than forming the high-side switch power MOSFET Q1 and low-side switch power MOSFET Q2 within the same semiconductor chip. Therefore, the production time and cost for the non-isolated DC-DC converter 1 can be reduced. Further, the operation stability of the non-isolated DC-DC converter 1 can be improved because the high-side switch power MOSFET Q1 is not adversely affected by the heat generated during an operation of the low-side switch power MOSFET Q2.

The configuration and features of a non-isolated DC-DC converter according to the present invention will now be described with reference to FIGS. 9 through 12.

Figure 9:
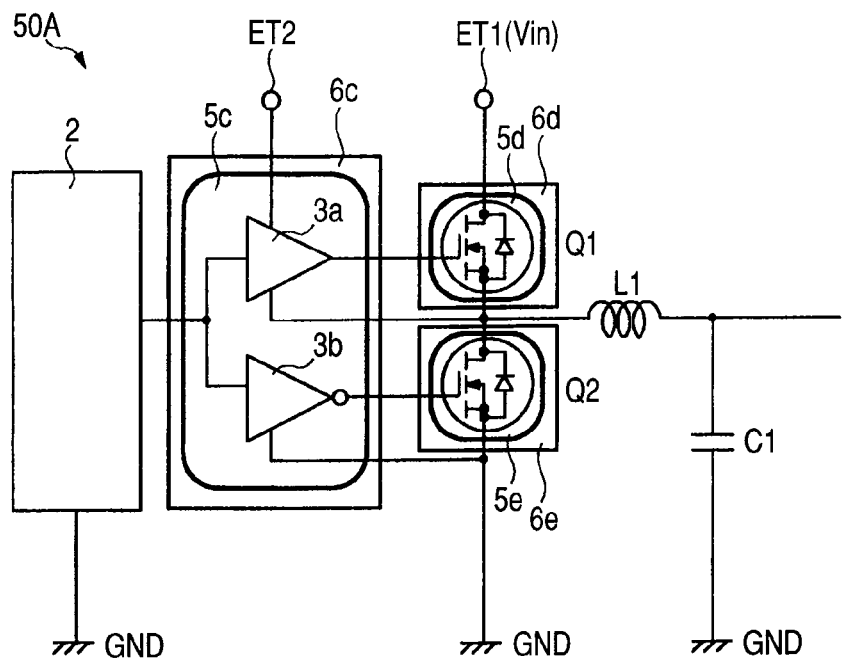
FIG. 9 illustrates the configuration of a semiconductor device according to the present invention.

In a non-isolated DC-DC converter 50A shown in FIG. 9, the driver circuits 3a and 3b, high-side switch power MOSFET Q1, and low-side switch power MOSFET Q2 are separately formed within semiconductor chips 5c through 5e and separately encased in packages 6c through 6e. When this configuration is employed, the voltage conversion efficiency decreases due to wiring inductance. Further, the overall size cannot be reduced.

Figure 10:
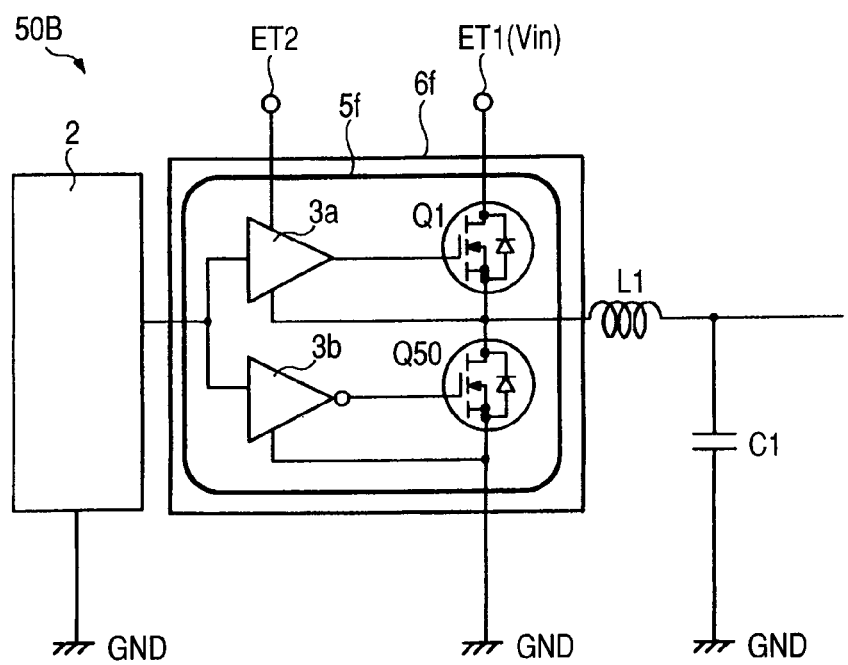
FIG. 10 illustrates the configuration of another semiconductor device according to the present invention.

In a non-isolated DC-DC converter 50B shown in FIG. 10, the driver circuits 3a and 3b, high-side switch power MOSFET Q1 (horizontal type), and a low-side switch power MOSFET Q50 (horizontal type) are formed within a single semiconductor chip 5f and encased in a single package 6f. In this configuration, which uses a single chip, the voltage conversion efficiency does not decrease due to wiring inductance. Further, the configuration is suitable for overall miniaturization. However, it is difficult to form different types of power MOSFETs within the same semiconductor chip 5f as described earlier. For the use of a single chip, it is necessary to use a horizontal power MOSFET for forming both the low-side switch power MOSFET Q50 and the high-side switch power MOSFET Q1. The ON resistance of the power MOSFET Q50 then becomes great. It is therefore impossible to achieve high voltage conversion efficiency in response to a large-current output request. It is also anticipated that the heat generated by the low-side switch power MOSFET Q50 may adversely affect the high-side switch power MOSFET Q1 through a semiconductor substrate.

Figure 11:
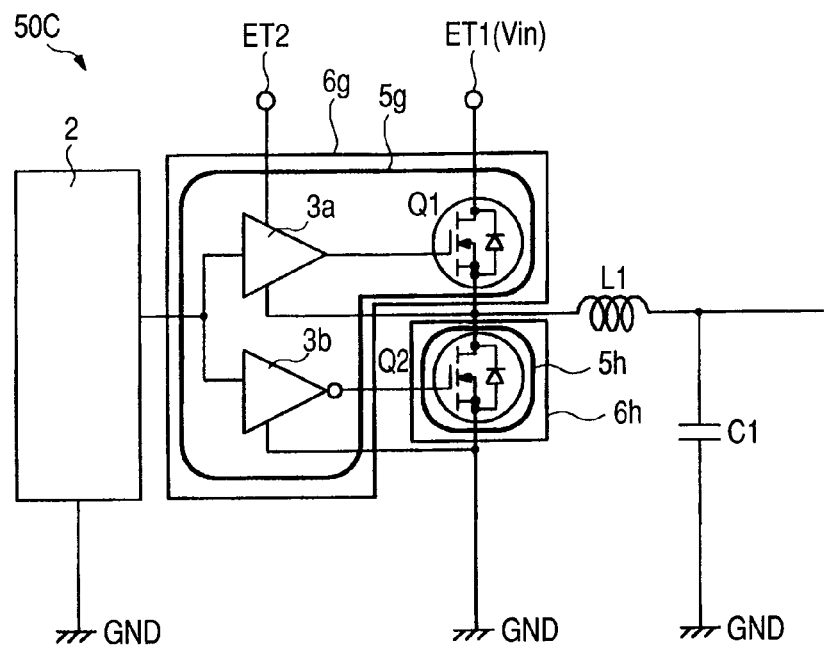
FIG. 11 illustrates the configuration of another semiconductor device according to the present invention.

In a non-isolated DC-DC converter 50C shown in FIG. 11, the driver circuits 3a and 3b and high-side switch power MOSFET Q1 (horizontal type) are formed within a single semiconductor chip 5g and encased in a package 6g, and the low-side switch power MOSFET Q2 (vertical type) is formed within a semiconductor chip 5h and encased in a package 6h. In this configuration, the wiring inductance for the high-side switch power MOSFET Q1 can be reduced; however, the voltage conversion efficiency decreases because the wiring inductance and resistance for the low-side switch power MOSFET Q2 increase. Further, since the separate packages 6g, 6h are used for encasing, this configuration is not suitable for overall miniaturization.

Figure 12:
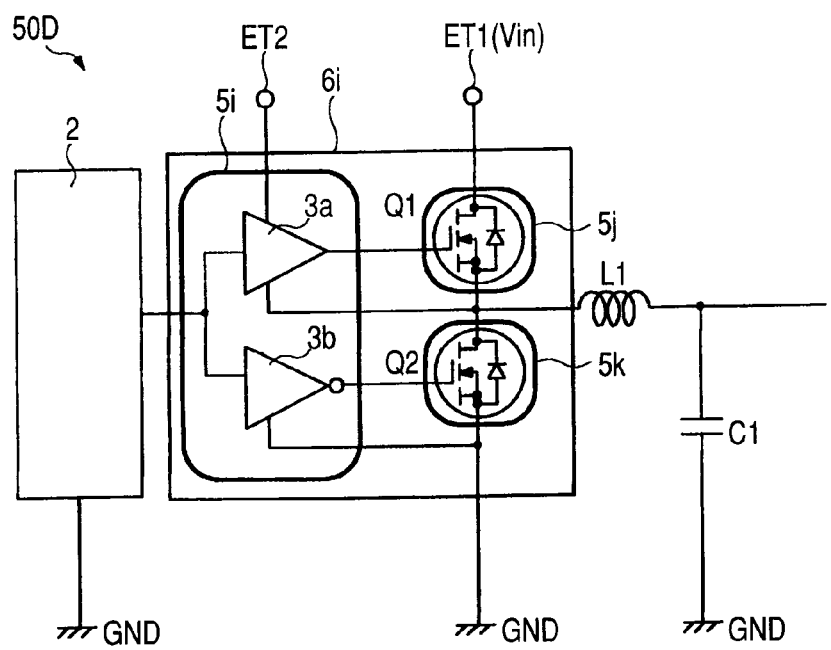
FIG. 12 illustrates the configuration of still another semiconductor device according to the present invention.

In a non-isolated DC-DC converter 50D shown in FIG. 12, the driver circuits 3a and 3b, high-side switch power MOSFET Q1 (horizontal type), and low-side switch power MOSFET Q2 (vertical type) are formed within separate semiconductor chips 5i, 5j, 5k, and these three semiconductor chips 5i, 5j, 5k are encased in a single package 6i. This configuration is ideally suited for overall miniaturization. However, since the frequency of the non-isolated DC-DC converter 50D is increased, wiring inductance LsH of the high-side switch power MOSFET Q1 is greater than in the configurations shown in FIGS. 10 and 11. As a result, this configuration decreases the voltage conversion efficiency.

FIG. 13 shows parameter comparisons of the non-isolated DC-DC converter 1 according to the first embodiment, which is shown in FIG. 8, and the non-isolated DC-DC converters 50A to 50D shown in FIGS. 9 through 12. The non-isolated DC-DC converter 1 according to the first embodiment is superior to the others particularly in wiring inductance reduction and miniaturization and better than the others in an overall sense as well.

A typical configuration of the non-isolated DC-DC converter 1 according to the first embodiment, which is shown in FIG. 8, will now be described in detail with reference to FIGS. 14 through 17.

Figure 14:
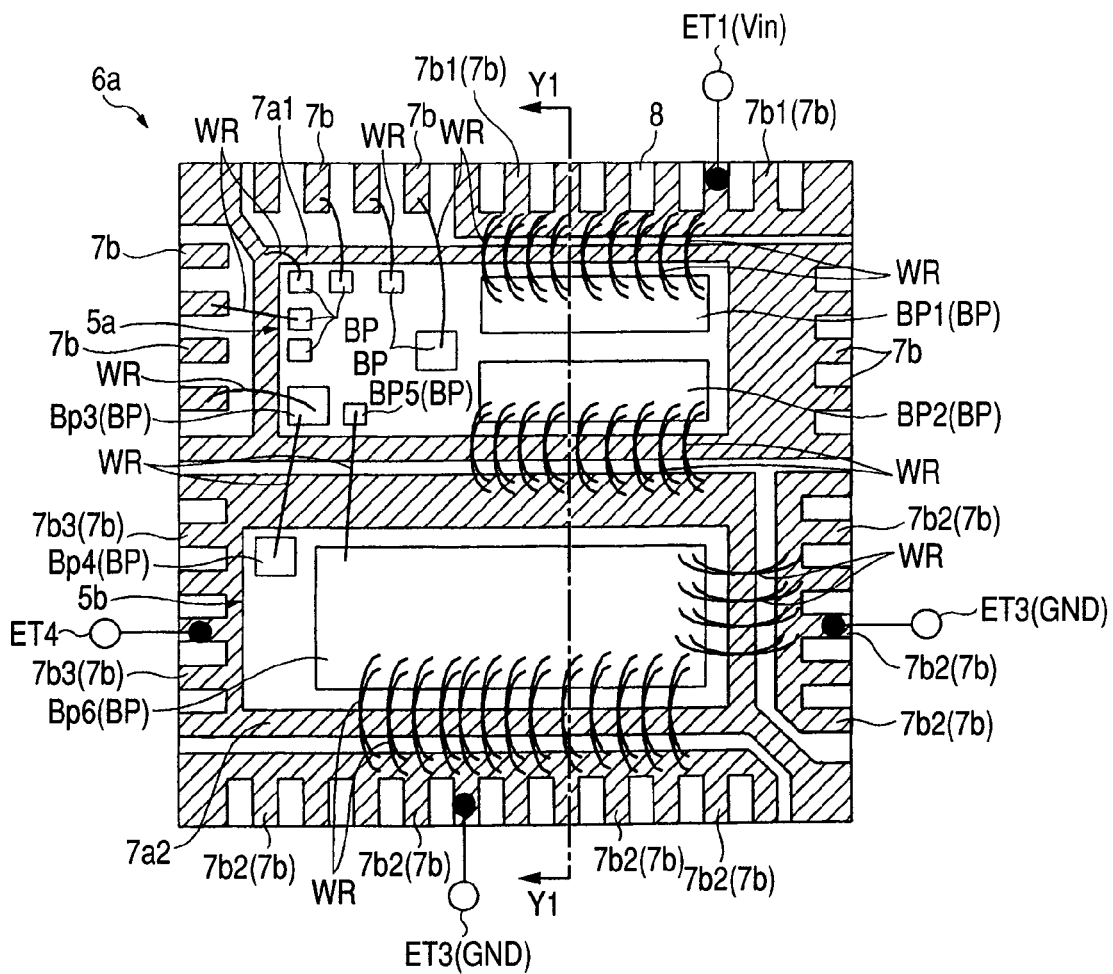
FIG. 14 is a plan view illustrating a typical package configuration of the semiconductor device shown in FIG. 1.
Figure 15:
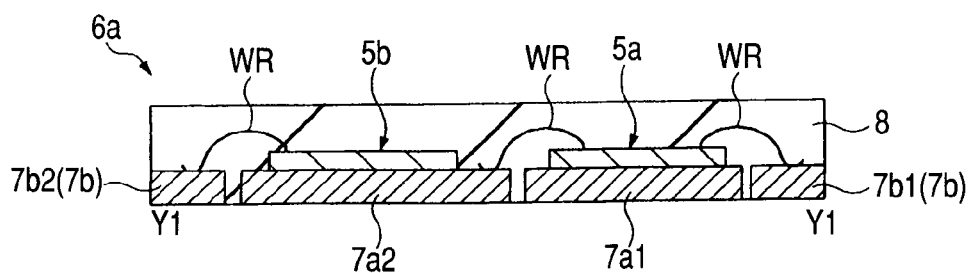
FIG. 15 shows cross section Y1-Y1 of FIG. 14.
Figure 16:
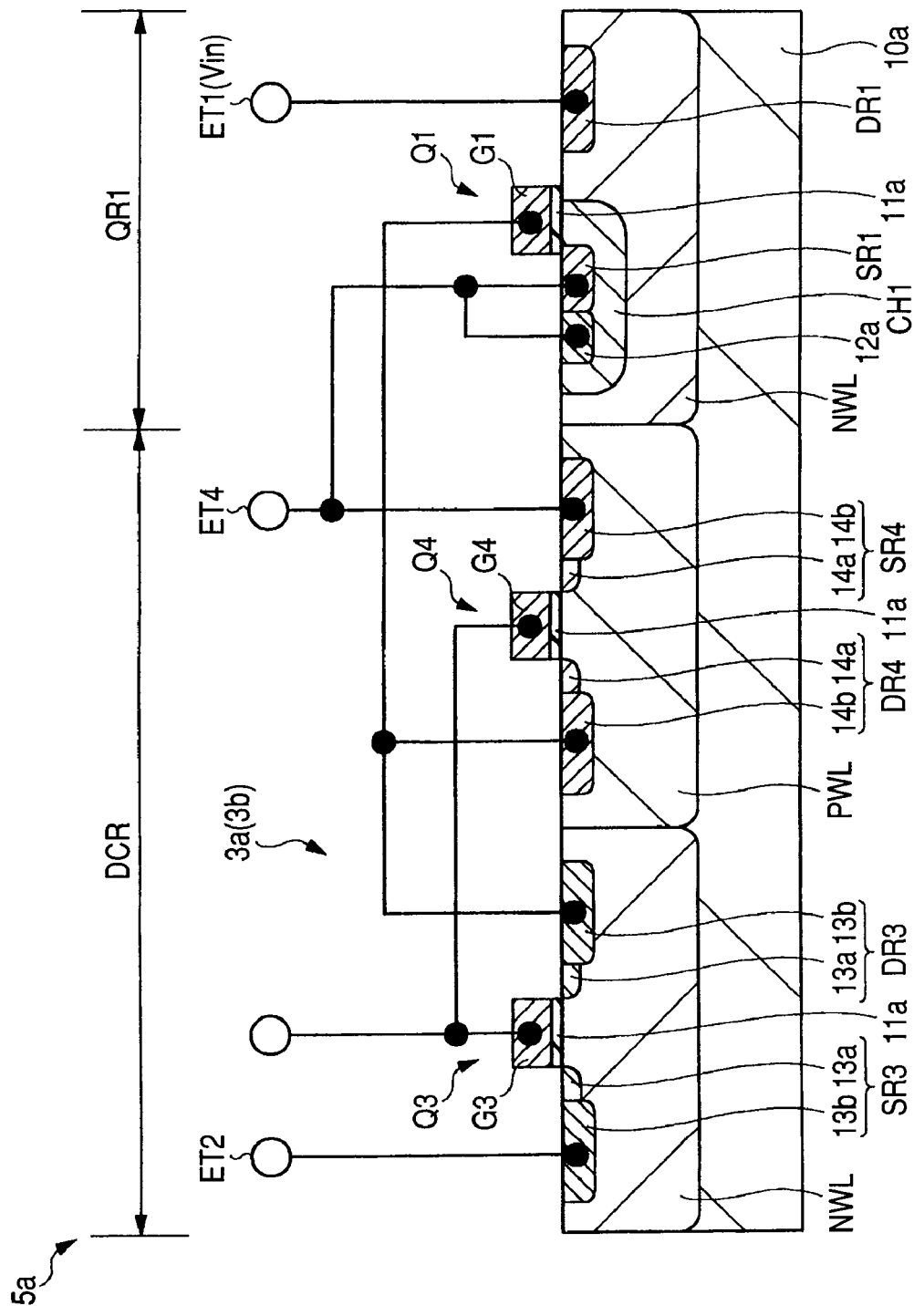
FIG. 16 shows an essential part cross section of a first semiconductor chip of a semiconductor device according to one embodiment of the present invention.
Figure 17:
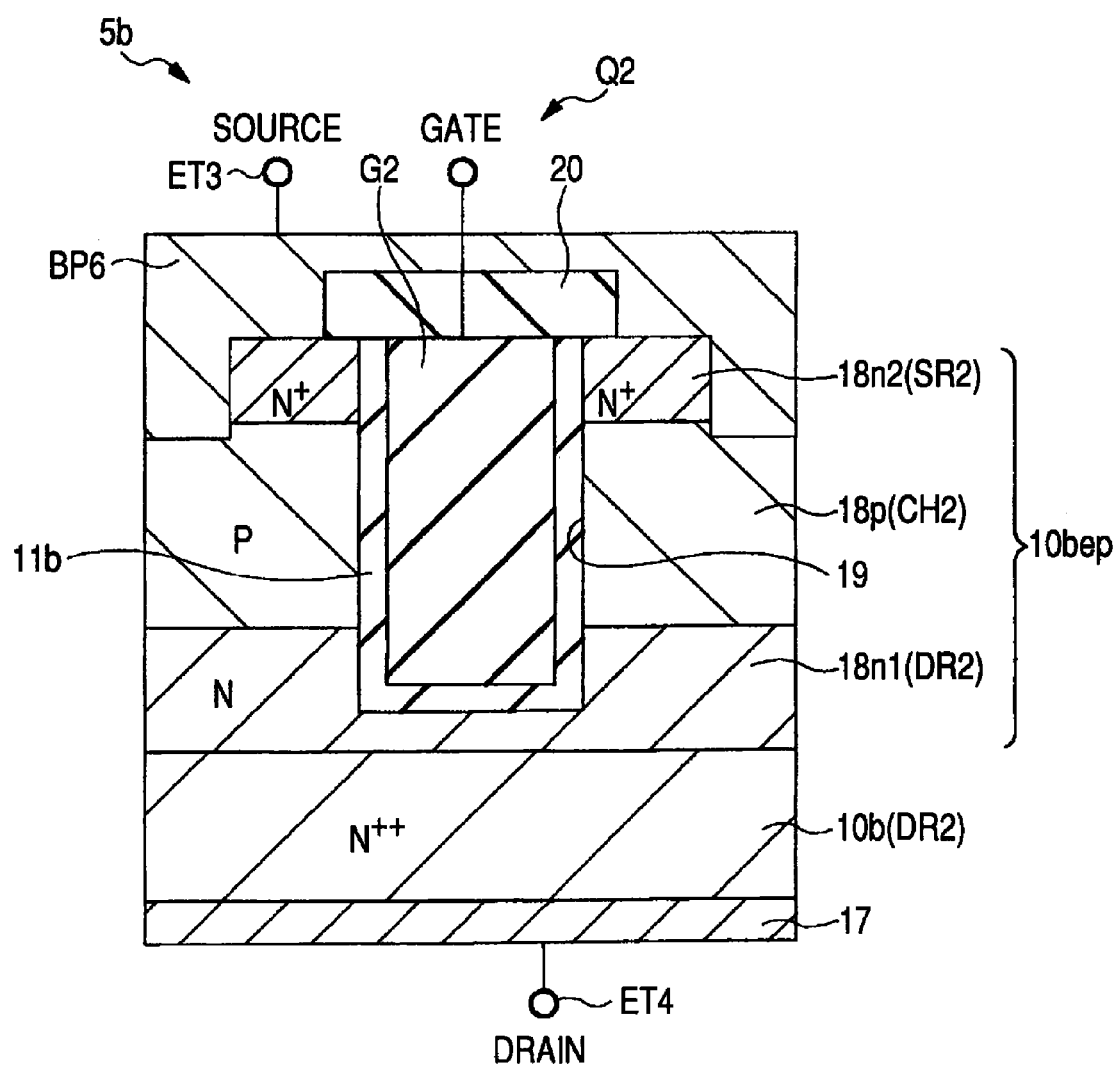
FIG. 17 shows an essential part cross section of a second semiconductor chip of a semiconductor device according to one embodiment of the present invention.

FIG. 14 is a plan view illustrating a typical configuration of the package 6a that contains a part of the circuitry for the non-isolated DC-DC converter 1. FIG. 15 shows cross section Y1-Y1 of FIG. 14. FIG. 16 shows an essential part cross section of the semiconductor chip 5a, which is shown in FIG. 14. FIG. 17 shows an essential part cross section of the semiconductor chip 5b, which is shown in FIG. 14. For enhanced drawing viewability, FIG. 14 excludes casing 8 over the semiconductor chips 5a and 5b, die pads 7a1 and 7a2, and leads 7b. In addition, die pads 7a1 and 7a2 and leads 7b are hatched.

The package 6a according to the first embodiment, which is mentioned above, is, for instance, a QFN (Quad Flat Non-leaded package). However, various other packages may be used instead of a QFN. For example, a QFP (Quad Flat Package), SOP (Small Outline Package), or other similar flat package may be used. The package 6a includes the two die pads (chip mounting members) 7a1, 7a2, the plurality of leads 7b, a bonding wire (hereinafter abbreviated to a wire) WR, and a casing 8. The die pads 7a1, 7a2 and leads 7b are made, for instance, of 42 Alloy or other similar metal. The wire WR is made, for instance, of gold (Au). The casing 8 is made, for instance, of epoxy resin.

The semiconductor chip 5a is mounted on the die pad 7a1 with its main surface facing upward. The driver circuits 3a and 3b and high-side switch horizontal power MOSFET Q1 are formed on the main surface of the semiconductor chip 5a as described earlier. A plurality of bonding pads (hereinafter abbreviated to pads) BP are mounted on the main surface of the semiconductor chip 5a as external terminals for providing electrical connections to various circuit electrodes. Meanwhile, the low-side switch vertical power MOSFET Q2 is formed on the semiconductor chip 5b. The plurality of pads BP are also mounted on the main surface of the semiconductor chip 5b. Each of the pads BP is made, for instance, of aluminum or other similar metal.

The pads BP for the semiconductor chips 5a and 5b are electrically connected to various parts via the abovementioned wire WR. The pad BP1, which is used for the drain of the power MOSFET Q1 in the semiconductor chip 5a, is electrically connected via a plurality of wires WR to lead 7b1, which is connected to the terminal ET1. A pad BP2, which is used for the source of the power MOSFET Q1 in the semiconductor chip 5a, is electrically connected to the die pad 7a2 via a plurality of wires WR. A pad BP3, which is used as an output of the driver circuit 3b in the semiconductor chip 5a, is electrically connected via a wire WR to a pad BP4, which is used for the gate of the power MOSFET Q2 in the semiconductor chip 5b. A pad BP5, which is used to supply the reference potential for the driver circuit 3b of the semiconductor chip 5a, is electrically connected via a wire WR to a pad BP6, which is used for the source of the power MOSFET Q2 in the semiconductor chip 5b. The pad BP6, which is used for the source of the semiconductor chip 5b, is electrically connected to a lead 7b2 (7b) via a plurality of wires. The reference potential GND is supplied to the lead 7b2 via a terminal ET3. The back surface of the semiconductor chip 5b serves as a drain electrode for the power MOSFET Q2 and is electrically connected to the die pad 7a2. The die pad 7a2 is electrically connected to a lead 7b3, which is integral with the die pad 7a2. A lead 7b3 is electrically connected to terminal ET4. The terminal ET4 is electrically connected to the aforementioned coil L1.

The semiconductor chips 5a and 5b and wires WR are enclosed in the casing 8; however, the back surfaces of the die pads 7a1 and 7a2 (the surfaces opposing the chip mounting surface) are exposed to the outside. The heat generated during an operation of the semiconductor chips 5a and 5b is radiated to the outside from the back surfaces of the semiconductor chips 5a and 5b via the die pads 7a1 and 7a2. This improves the heat radiation capability of the non-isolated DC-DC converter 1. When the structure described above is employed, both the back surfaces of die pads 7a1 and 7a2 (the surfaces opposing the surfaces on which the semiconductor chips 5a and 5b are mounted) and the back surfaces of leads 7b (the surfaces opposing the surface to which the wires WR is connected and joining with the wiring board terminals) exist on the surface for mounting the package 6a (the surface opposing the wiring board when the package 6a is mounted on the wiring board).

FIG. 16 shows an essential part cross section of the semiconductor chip 5a, which is mentioned above. The right-hand side of FIG. 16 shows a unit formation region QR1 of the power MOSFET Q1. The left-hand side of FIG. 16 shows a unit formation region DCR of the driver circuit 3a. The power MOSFET Q1 in a unit region is shown in FIG. 16. In reality, however, a plurality of power MOSFETs Q1 exist to form a single power MOSFET Q1. Since the device structure of driver circuit 3b is almost the same as that of driver circuit 3a, driver circuit 3b is not described herein.

A semiconductor substrate 10a for the semiconductor chip 5a is made of a p-type silicon (Si) single crystal. A p-well PWL and an n-well NWL are formed on its main surface. In the n-well NWL in the unit formation region QR1, an n-channel horizontal power MOSFET Q1 is formed. The power MOSFET Q1 includes an n+ source region SR1, an n+ drain region DR1, a p-type channel formation region CH1, a gate insulation film 11a, and a gate electrode G1. A desired potential is supplied to the channel formation region CH1 via a p+ semiconductor region 12a, which is formed on the front side of the channel formation region CH1. The current I1, which flows during an operation of the power MOSFET Q1 as described earlier, flows from the drain region DR1 toward the source region SR1 via the channel formation region CH1 and along the main surface of the semiconductor substrate 10a. This horizontal power MOSFET Q1 has a smaller channel width per unit cell area than a vertical MOSFET, and exhibits a great ON resistance. However, it is possible to reduce the gate area per unit cell area and decrease the area of a joint between the gate electrode and drain drift layer. Therefore, the parasitic capacity between the gate and drain can be reduced.

The driver circuit 3a (3b), which is formed, for instance, by a CMOS (Complementary MOS) inverter circuit, is formed in the unit formation region DR1. The driver circuit 3a (3b) is formed by a p-channel horizontal power MOSFET Q3, which is formed in the n-well NWL in the formation area DR1, and an n-channel horizontal power MOSFET Q4, which is formed in the p-well PWL. The power MOSFET Q3 includes a source region SR3, a drain region DR3, a gate insulation film 11a, and a gate electrode G3. The source region SR3 and drain region DR3 include a p– semiconductor region 13a and a p+ semiconductor region 13b. The power MOSFET Q4 includes a source region SR4, a drain region DR4, a gate insulation film 11a, and a gate electrode G4. The source region SR4 and drain region DR4 include an n– semiconductor region 14a and an n+ semiconductor region 14b.

FIG. 17 is a cross-sectional view of a unit region of the power MOSFET Q2 in the semiconductor chip 5b, which is described above. The power MOSFET Q2 in a unit region is shown in FIG. 17. In reality, however, a plurality of power MOSFETs Q2 exist to form a single power MOSFET Q2.

The semiconductor substrate 10b for the semiconductor chip 5b is made, for instance, of an n++ silicon (Si) single crystal. On its back surface, the abovementioned drain electrode (external terminal) 17 for the power MOSFET Q2 is formed. The drain electrode 17 is formed, for instance, by vapor-depositing gold (Au) or other metal, and connected to the die pad 7a2 as described earlier. Meanwhile, an epitaxial layer 10bep, which is made of an n-type silicon single crystal, is formed on the main surface of the semiconductor substrate 10b. In the epitaxial layer 10bep, three regions are formed. From bottom to top, the three regions are an n-type semiconductor region 18n1, a p-type semiconductor region 19p, and an n+ type semiconductor region 18n2. In the semiconductor substrate 10b and epitaxial layer 10bep, for example, a trench-gate-structured, n-channel vertical power MOSFET Q2 is formed.

The power MOSFET Q2 includes the above-mentioned n+ type semiconductor region 18n2, which functions as the source region SR2; the abovementioned n-type semiconductor region 18n1, which functions as the drain region DR2; the abovementioned p-type semiconductor region 18p, which functions as a channel formation region CH2; a gate insulation film 11b, which is formed on the inner wall surface of a groove 19 that is made in the direction of the thickness of the epitaxial layer 10bep; and a gate electrode G2, which is embedded in the groove 19 via the gate insulation film 11b. The gate electrode G2 is electrically connected to the pad BP4, which is used for the aforementioned gate. When a trench gate structure is employed as described above, it is possible to miniaturize and increase the density of a unit region of the power MOSFET Q2. A cap insulation film 20 is formed on the gate electrode G2 to provide insulation between the gate electrode and pad BP6, which is used for the source. The pad BP6 is electrically connected not only to the n+ type semiconductor region 18n2, which is used for the source, but also to the p-type semiconductor region 19p, which is used for channel formation. The current I2, which flows during an operation of power MOSFET Q2 as described earlier, flows in the direction of the depth of the groove 19 (flows in the direction of the thickness of the drift layer). The vertical power MOSFET Q2, which is described above, has a larger gate area per unit cell area than the horizontal power MOSFET Q1. Further, the vertical power MOSFET Q2 has a large joint area between the gate electrode and drain drift layer. Therefore, the channel width per unit cell area can be increased although the parasitic capacity between the gate and drain increases. As a result, the ON resistance can be reduced.

Figure 18:
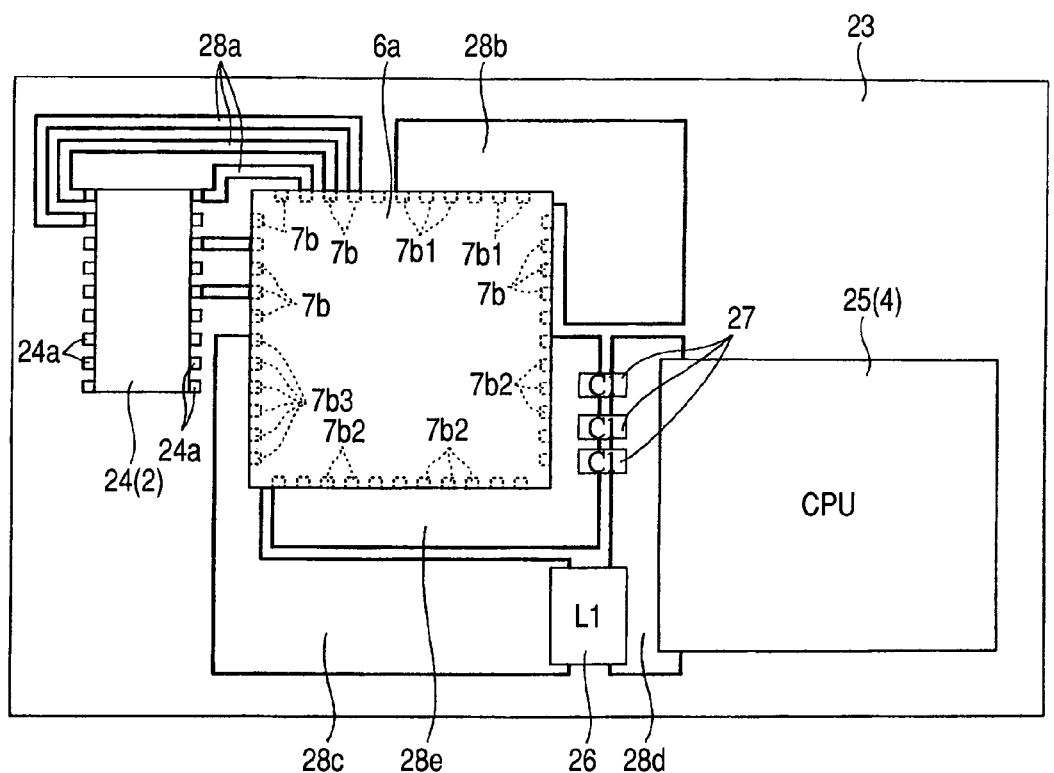
FIG. 18 is a plan view illustrating, as an example, how a semiconductor device according to one embodiment of the present invention is mounted.
Figure 19:
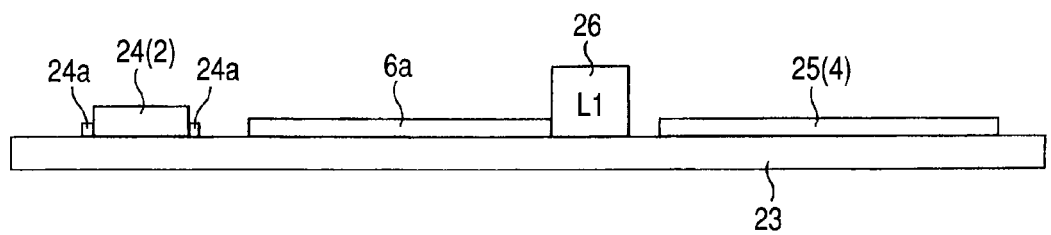
FIG. 19 is a side view of FIG. 18.

FIG. 18 is a plan view illustrating, as an example, how the above package 6a is mounted. FIG. 19 is a side view of the package shown in FIG. 18.

A wiring board 23 is, for instance, a printed wiring board. Packages 6a, 24, 25 and chip parts 26, 27 are mounted on the main surface of the wiring board. In the package 24, the aforementioned control circuit 2 is formed. In the package 25, the aforementioned load circuit 4 is formed. In the chip part 26, the aforementioned coil L1 is formed. In the chip parts 27, the aforementioned capacitor C1 is formed. A lead 24a of the package 24 is electrically connected to a lead 7b of the package 6a via a wire 28a on the wiring board 23. The lead 7b1 of the package 6a is electrically connected to a wire 28b on the wiring board 23. The lead 7b3 of the package 6a is electrically connected to one end of the coil L1 of the chip part 26 via a wire (output wire) 28c on the wiring board 23. The other end of the coil L1 is electrically connected to the load circuit 4 via wire (output wire) 28d on the wiring board 23. The lead 7b2, which is used for the reference potential GND of the wiring board 23, is electrically connected to one end of the capacitor C1 of a plurality of the chip parts 27 via a wire 28e on the wiring board 23. The other end of the capacitor C1 is electrically connected to the load circuit 4 via a wire 28d on the wiring board 23.

Second Embodiment

Figure 20:
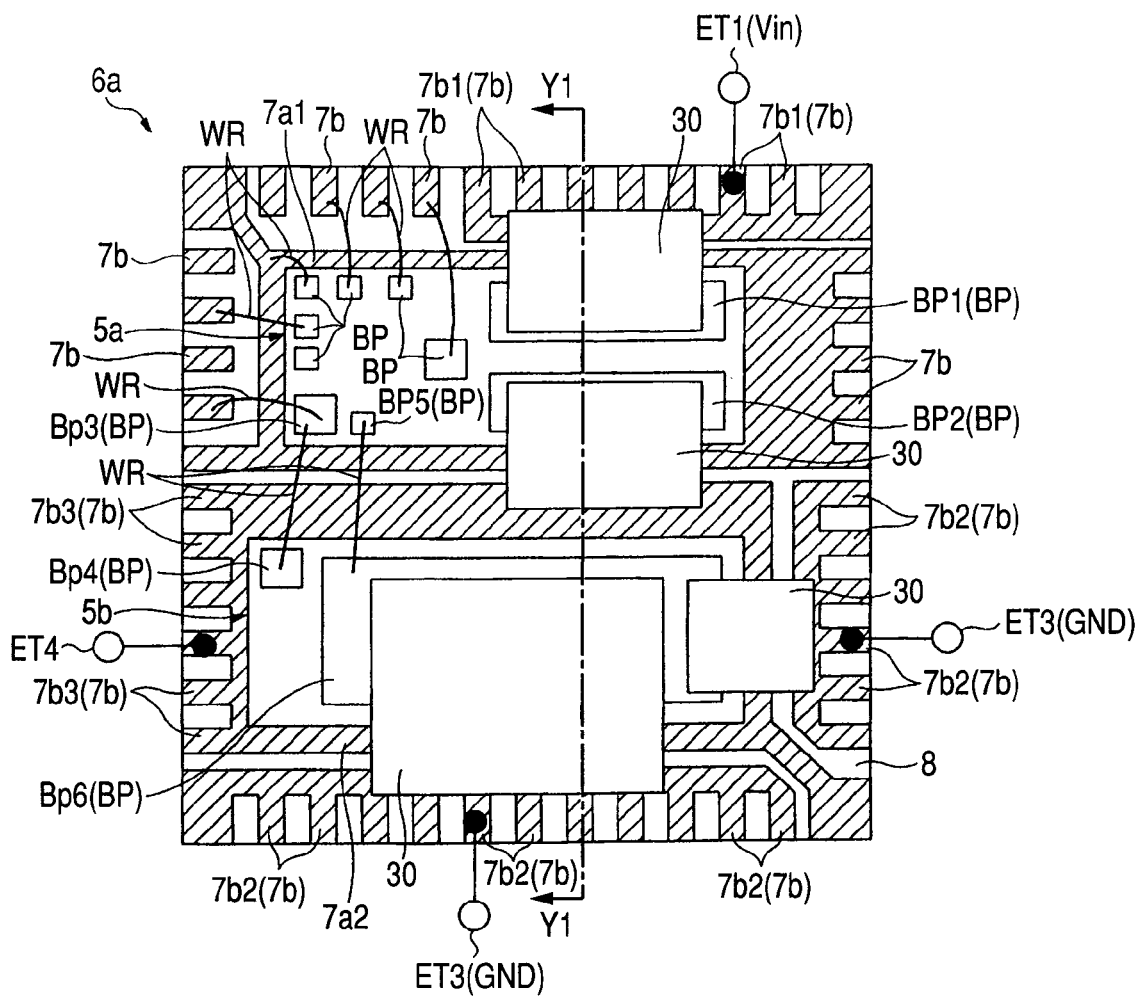
FIG. 20 is a plan view illustrating a typical package configuration of a semiconductor device according to another embodiment of the present invention.
Figure 21:
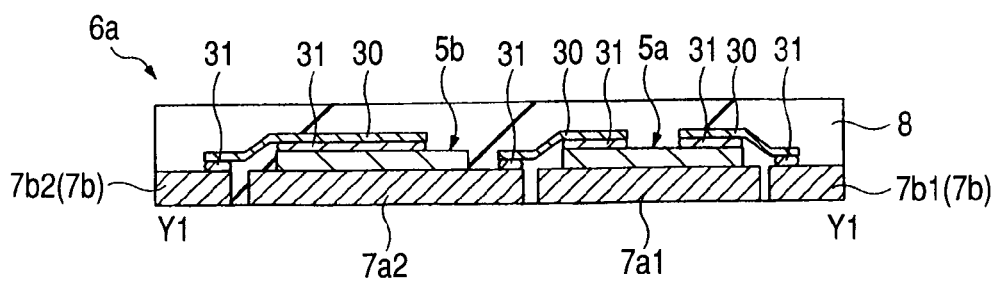
FIG. 21 shows cross section Y1-Y1 of FIG. 20.

A second embodiment of the non-isolated DC-DC converter 1 according to the present invention will now be described. FIG. 20 is a plan view illustrating a typical configuration of the package 6a including a part of the circuitry for the non-isolated DC-DC converter 1. FIG. 21 shows cross section Y1-Y1 of FIG. 20. For enhanced drawing viewability, FIG. 20 excludes part of the casing 8. In addition, the die pads 7a1 and 7a2 and leads 7b are hatched.

In the second embodiment, the wiring used to connect the pads BP and various parts is partly changed from the wires WR to metal plate wires 30. More specifically, the pad BP1, which is used for the drain of the power MOSFET Q1 in the semiconductor chip 5a, is electrically connected to the lead 7b1 via one of the metal plate wires 30. The pad BP2, which is used for the source of the power MOSFET Q1 in the semiconductor chip 5a, is electrically connected to the die pad 7a2 via a metal plate wire 30. The pad BP6, which is used for the source of the semiconductor chip 5b, is electrically connected to lead 7b2 (7b) via one of the metal plate wires 30. Each of the metal plate wires 30 is made of copper (Cu), aluminum (Al), or other similar metal, and electrically connected to a pad BP or lead 7b via a bump electrode 31. The bump electrode 31 is made, for instance, or solder, gold (Au), or other similar metal. Conductive resin may be used instead of the bump electrode 31. The metal plate wires 30 are entirely covered with the casing 8.

In the second embodiment, the metal plate wires 30 are used instead of the wires WR so that the inductance parasitic on the wiring path can be further decreased. Thus, the switch loss can be further reduced. As a result, the voltage conversion efficiency of the non-isolated DC-DC converter 1 can be further enhanced.

Third Embodiment

Figure 22:
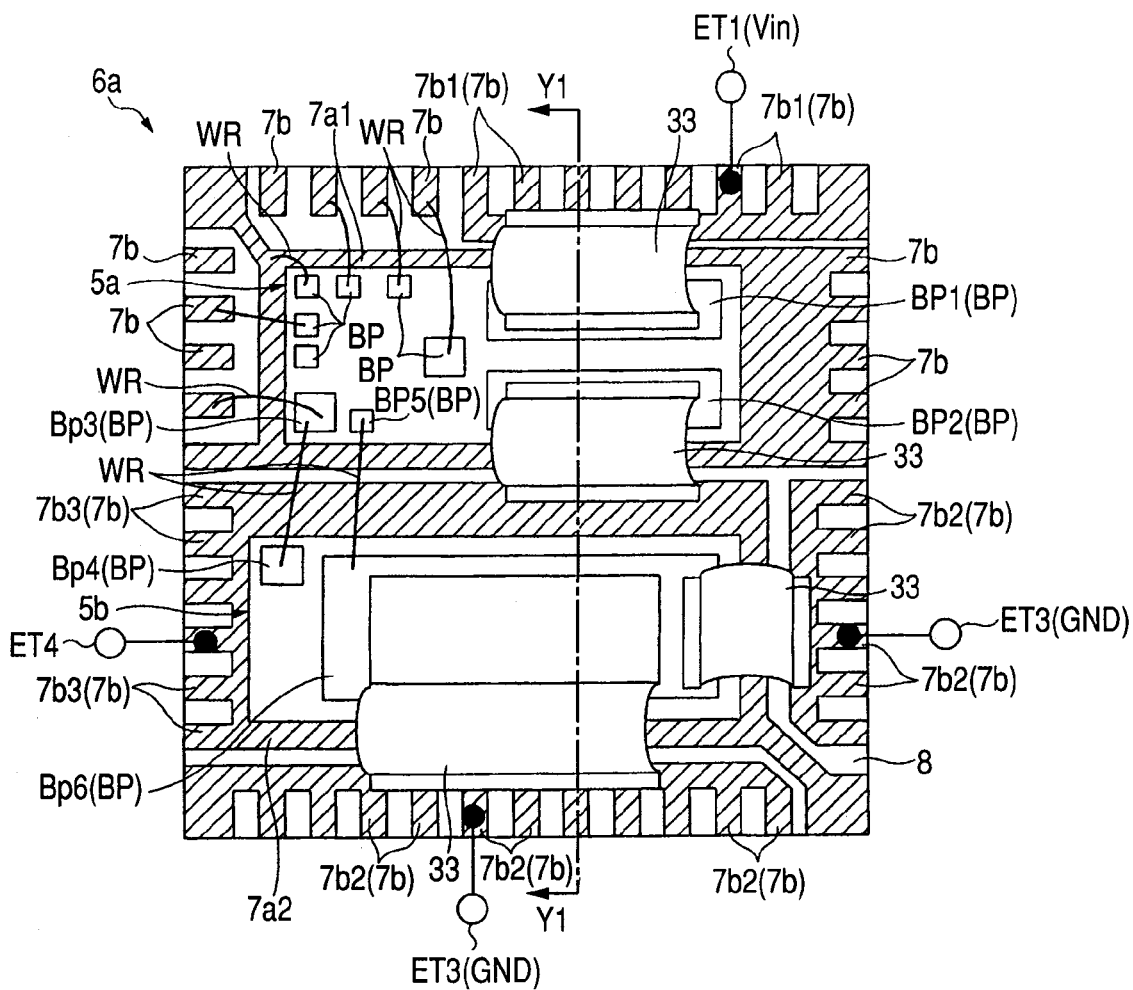
FIG. 22 is a plan view illustrating a typical package configuration of a semiconductor device according to another embodiment of the present invention.
Figure 23:
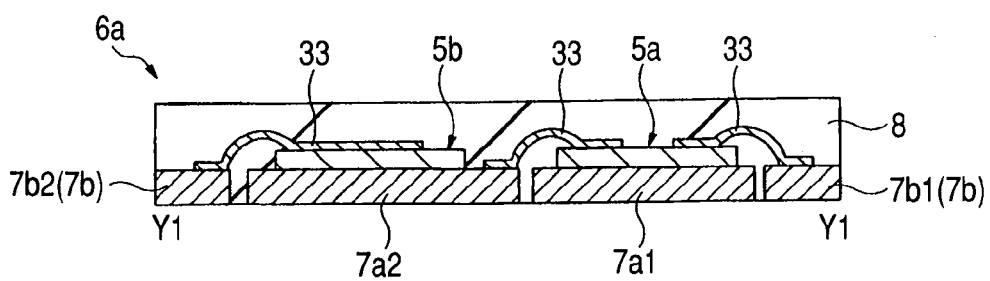
FIG. 23 shows cross section Y1-Y1 of FIG. 22.

A third embodiment of the non-isolated DC-DC converter 1 according to the present invention will now be described. FIG. 22 is a plan view illustrating a typical configuration of the package 6a including a part of the circuitry for the non-isolated DC-DC converter 1. FIG. 23 shows cross section Y1-Y1 of FIG. 22. For enhanced drawing viewability, FIG. 22 excludes part of the casing 8. In addition, the die pads 7a1 and 7a2 and leads 7b are hatched.

In the third embodiment, the wiring used to connect the pads BP and various parts is partly changed from the abovementioned wires WR to ribbon wires 33. The connections of the ribbon wires 33 are not described herein because they are the same as those of the metal plate wires 30, which are used in the second embodiment. The ribbon wires 33 are made, for instance, of copper (Cu), aluminum (Al), or other similar metal as is the case with the aforementioned metal plate wires 30. However, the ribbon wires 33 are thinner and more flexible than the metal plate wires 30. The ribbon wires 33 are entirely covered with the casing 8. The ribbon wires 33 are compressed, for instance, by using ultrasonic waves before being mounted. However, an alternative mounting method may be used. For example, the ribbon wires 33 may be mounted through the use of copper (Cu), solder, or conductive resin.

In the third embodiment, the ribbon wires 33 are used instead of the wires WR so that the inductance parasitic on the wiring path can be decreased. Thus, the switch loss can be further reduced. As a result, the voltage conversion efficiency of the non-isolated DC-DC converter 1 can be further enhanced.

Further, the use of the ribbon wires 33 in the third embodiment provides a higher degree of freedom in joining than in the second embodiment. When the semiconductor chips 5a and 5b are mounted on the die pads 7a1 and 7a2, the mounting positions of the semiconductor chips 5a and 5b may slightly vary from one mounting process to another. In such an instance, the pad-to-lead distance may vary. If the metal plate wires 30 are used as described in conjunction with the second embodiment, such distance variations may not always be handled properly. However, when the ribbon wires 33, which are softer than the metal plate wires 30, are used, the curvature of the ribbon wires 33 can be varied to properly handle the above distance variations. As a result, the joining reliability and the yield can be both increased.

Fourth Embodiment

Heat generation during an operation is another problem caused when the current and frequency of a DC-DC converter are increased. In the configuration employed by the first, second, or third embodiment, high heat radiation capability is required because two semiconductor chips 5a, 5b are encased in a single package 6a. A fourth embodiment of the present invention will now be described with reference to heat radiation capability.

Figure 24:
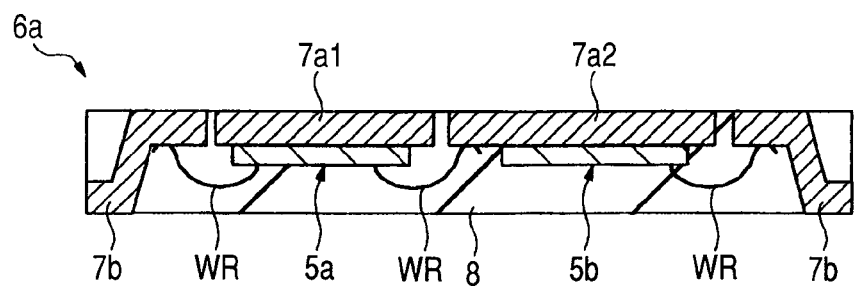
FIG. 24 is a cross-sectional view illustrating a typical package configuration of a semiconductor device according to another embodiment of the present invention.

FIG. 24 is a cross-sectional view of the package 6a according to the fourth embodiment. In the fourth embodiment, the leads 7b are formed in a manner reverse to that for the leads 7b in the first to third embodiments. When such a structure is employed, the back surfaces of the die pads 7a1 and 7a2 (the surfaces opposing the surface on which the semiconductor chips 5a and 5b are mounted) are exposed out of the upper surface the package 6a, and the back surfaces of leads 7b (the surface for joining with the wiring board terminals) are exposed out of the surface for mounting the package 6a.

Figure 25:
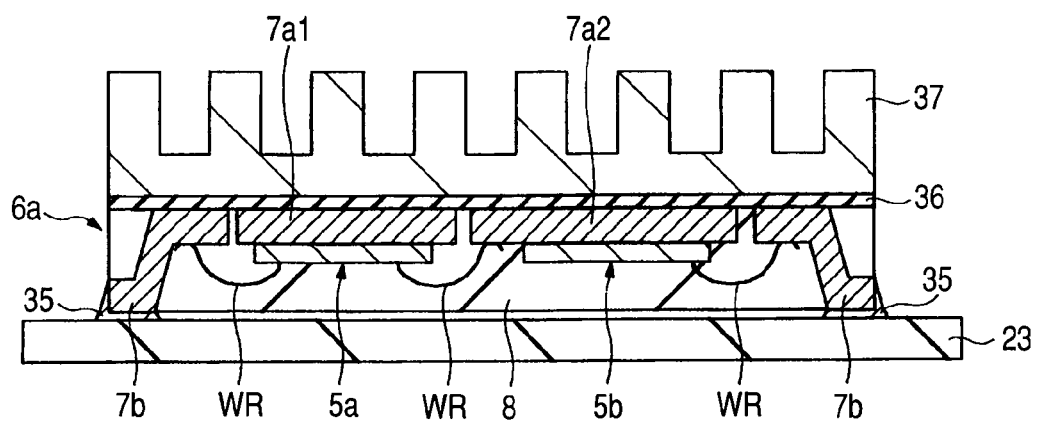
FIG. 25 is a cross-sectional view illustrating the semiconductor device that is shown in FIG. 24 and provided with a heat sink.

FIG. 25 is a cross-sectional view illustrating, as an example, how the package 6a shown in FIG. 24 is mounted on the wiring board 23. The leads 7b on the back surface (mounting surface) of the package 6a are joined to the terminals on the wiring board 23 via solder or other similar adhesive material 35. A radiation fin (heat sink) 37 is joined to the upper surface of the package 6a, that is, the back surfaces of the die pads 7a1 and 7a2, via silicone rubber sheet or other similar insulation sheet 36 that exhibits high thermal conductivity. When the configuration described above is employed, the heat generated by the semiconductor chips 5a and 5b propagates from the back surfaces of the semiconductor chips 5a and 5b to the radiation fin 36 via the die pads 7a1 and 7a2, and then becomes dissipated. This ensures that high heat radiation capability can be obtained even when the current and frequency of the non-isolated DC-DC converter 1 are increased within a configuration in which two semiconductor chips 5a, 5b are contained in a single package 6a. Although an air-cooled heat sink is illustrated herein, an alternative is to use a liquid-cooled heat sink that has a flow path for flowing a cooling liquid to a radiator.

Fifth Embodiment

A fifth embodiment of the present invention will now be described with reference to an example of a modified version of the heat radiation scheme that has been described above.

Figure 26:
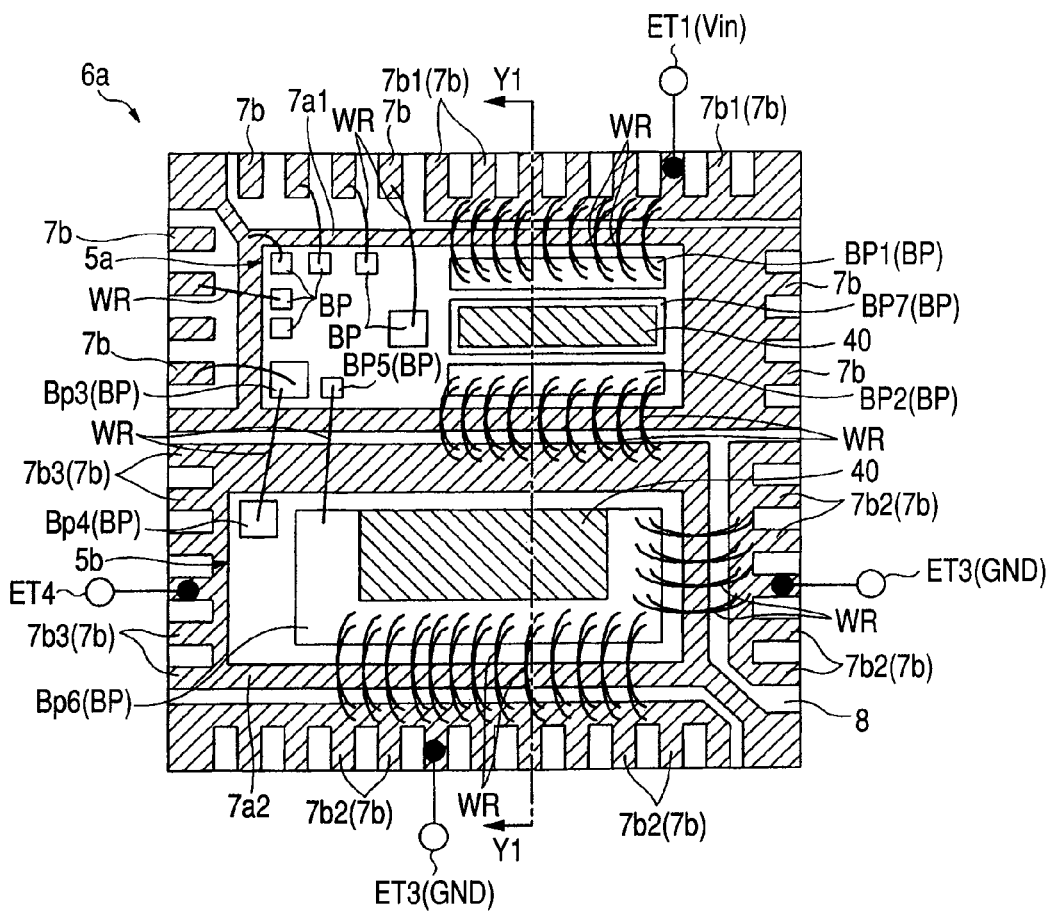
FIG. 26 is a plan view illustrating a typical package configuration of a semiconductor device according to another embodiment of the present invention.
Figure 27:
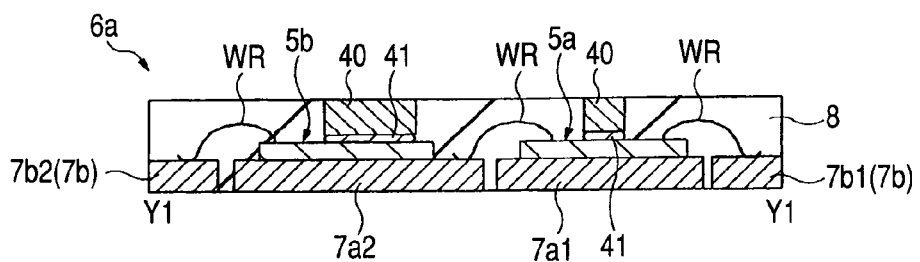
FIG. 27 shows cross section Y1-Y1 of FIG. 26.

FIG. 26 is a plan view illustrating a typical configuration of the package 6a including a part of the circuitry for the non-isolated DC-DC converter 1, which has been described in conjunction with another embodiment. FIG. 27 shows cross section Y1-Y1 of FIG. 26. For enhanced drawing viewability, FIG. 26 excludes part of the casing 8. In addition, the die pads 7a1 and 7a2, leads 7b, and metallic bodies 40 are hatched.

In the fifth embodiment, the metallic bodies 40 are joined to the main surfaces of the semiconductor chips 5a and 5b. The metallic bodies 40 are partially exposed out of the casing 8. The metallic bodies 40 are made, for instance, of copper, aluminum, or other metal that exhibits high thermal conductivity, and joined to a dummy pad BP7 for the semiconductor chip 5a and the source pad BP6 for the semiconductor chip 5b via adhesive 41, which is made, for instance, of solder or conductive resin. The metallic bodies 40 are positioned so as to particularly cover the formation regions for the power MOSFETs Q1 and Q2, which are the heat generation sources in semiconductor chips 5a and 5b. When the configuration described above is employed, the heat generated by the semiconductor chips 5a and 5b is not only radiated from the back surfaces of the semiconductor chips 5a and 5b toward the wiring board via die pads 7a1 and 7a2, but also radiated from the main surfaces of the semiconductor chips 5a and 5b to the outside via the metallic bodies 40. This ensures that high heat radiation capability is obtained. The heat radiation capability can be further enhanced by mounting a radiation fin 37 on the upper surface of package 6a as described in conjunction with the fourth embodiment and joining the radiation fin 37 to the exposed surface of the metallic bodies 40. The dummy pad BP7 is positioned so as to cover the formation region of the power MOSFET Q1. It is preferred that the dummy pad BP7 be electrically connected to the circuitry within the semiconductor chip 5a for heat radiation capability enhancement. To avoid a short circuit, however, such an electrical connection should not be made. When such an electrical connection is not made, the dummy pad BP7 is mounted, for instance, via an insulation board.

Sixth Embodiment

A sixth embodiment of the present invention will now be described with reference to an example of a modified version of the heat radiation scheme that has been described earlier.

Figure 28:
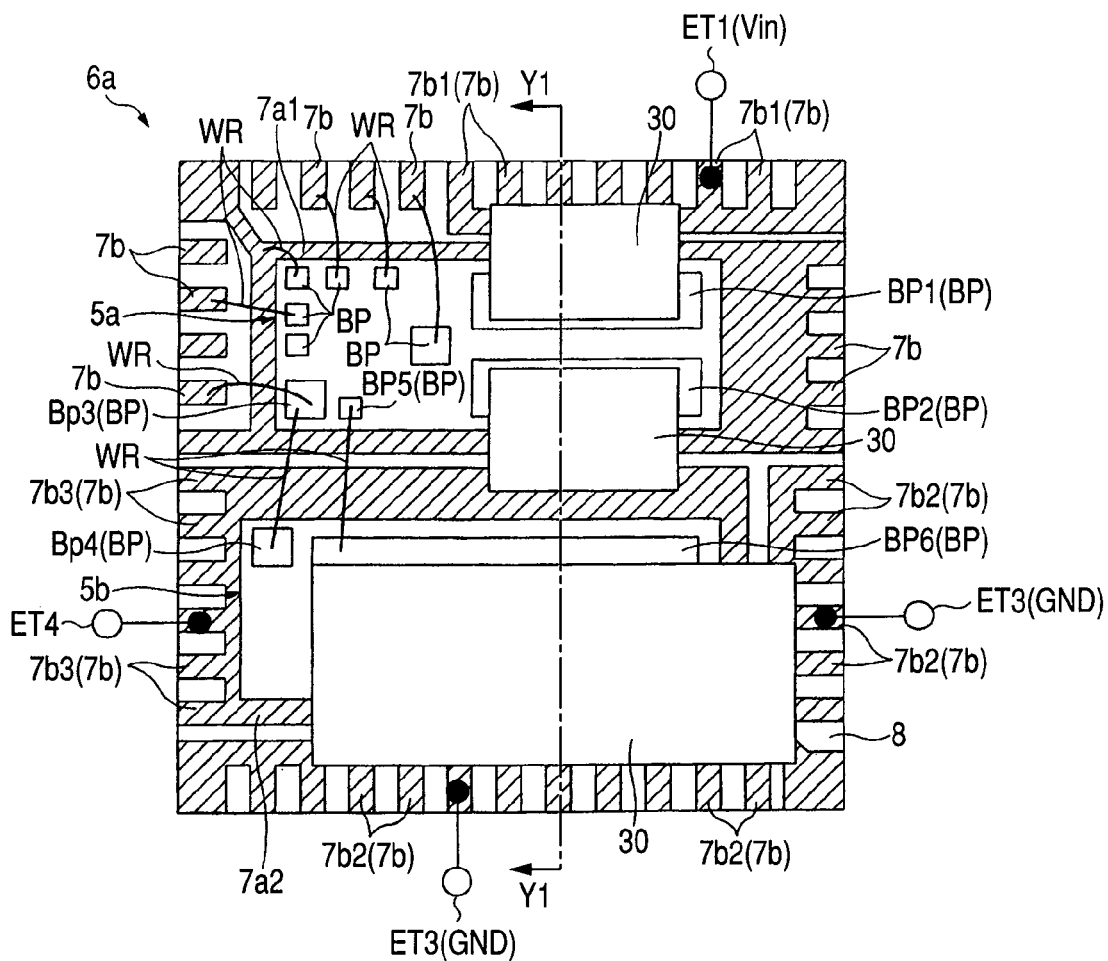
FIG. 28 is a plan view illustrating a typical package configuration of a semiconductor device according to still another embodiment of the present invention.
Figure 29:
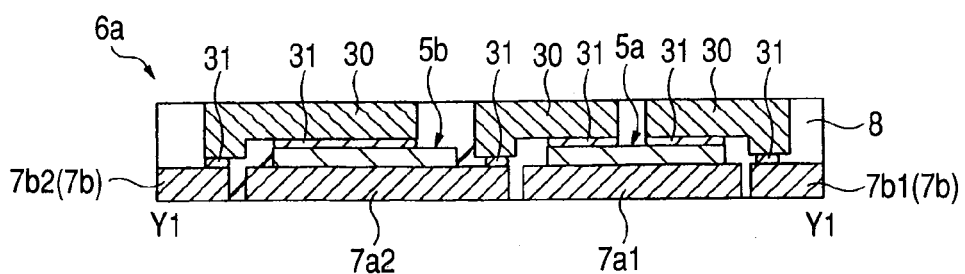
FIG. 29 shows cross section Y1-Y1 of FIG. 28.

FIG. 28 is a plan view illustrating a typical configuration of the package 6a including a part of the circuitry for the non-isolated DC-DC converter 1, which has been described in conjunction with another embodiment. FIG. 29 shows cross section Y1-Y1 of FIG. 28. FIG. 30 is a plan view illustrating the upper surface of the package 6a shown in FIG. 28. FIG. 31 is a plan view that illustrates the upper surface of the package 6a in order to indicate a typical modified version of FIG. 30. For enhanced drawing viewability, FIG. 28 excludes part of the casing 8. In addition, the die pads 7a1 and 7a2 and leads 7b are hatched.

In the sixth embodiment, the wiring used to connect the pads BP and various parts is partly changed from the aforementioned wires WR to the metal plate wires 30 as is the case with the second embodiment. Further, the metal plate wires 30 are partly exposed out of the casing 8. The metal plate wires 30 are positioned so as to particularly cover the formation regions of the power MOSFET Q1 and Q2, which are the heat generation sources of the semiconductor chips 5a and 5b. In FIGS. 28 through 30, the metal plate wires 30 on both sides of the semiconductor chips 5a and 5b are exposed out of the upper surface of the package 30. However, an alternative configuration may be employed, as indicated in FIG. 31, so as to expose only the metal plate wire 30 for semiconductor chip 5b in which low-side switch power MOSFET Q2 (which exhibits a relatively great heat release value) is formed. In the sixth embodiment, too, the heat radiation capability can be further enhanced by mounting the radiation fin 37 on the upper surface of the package 6a as described in conjunction with the fourth embodiment and joining the radiation fin 37 to the exposed surface of the metal plate wire 30.

The sixth embodiment incorporates the heat radiation function of the metal plate wiring 30 in addition to the functions that are provided by the second and fifth embodiments. Therefore, the sixth embodiment does not require the addition of any other heat radiation parts. Consequently, the number of assembly process steps for the package 6a can be rendered smaller than when the fifth embodiment is used. Thus, the assembly time required for the package 6a can be reduced. As a result, the cost of a semiconductor device can be decreased.

While the present invention has been described in conjunction with the preferred embodiments of the present invention, persons of skill in the art will appreciate that variations may be made without departure from the scope and spirit of the invention.

In the foregoing embodiments, a flat package structure is illustrated as the package structure. However, the present invention is not limited to the use of a flat package structure. For example, a BGA (Ball Grid Array) package structure may be alternatively used.

In the foregoing embodiments, a power MOSFET is illustrated as a DC-DC converter, which is widely used as a power supply circuit. However, the present invention is not limited to the use of such a power MOSFET. For example, an alternative is to use a power MISFET (Metal Insulator Semiconductor Field Effect Transistor) structure in which insulation film is used in place of oxide film.

In the foregoing embodiments, the illustrated power MOSFET uses a gate electrode made of metal. However, the present invention is not limited to the use of a gate electrode made of metal. For example, an alternative is to use a structure in which polycrystalline silicon (poly-Si) is used instead of metal.

Although the present invention has been described with reference to a case where the present invention is applied to a power supply circuit for driving a CPU or DSP, the present invention can also be applied to various other power supply circuits, including a power supply circuit for driving a circuit other than a CPU and DSP.

The present invention can be applied to the manufacture of a semiconductor device.

What is claimed is:

1. A semiconductor device covered with a resin body, the semiconductor device comprising:
    a high side transistor,
    a low side transistor,
    a first driver circuit to drive the high side transistor, and
    a second driver circuit to drive the low side transistor,
    the resin body having a top surface and a bottom surface opposite to the top surface,
    the semiconductor device comprising:
    a first die pad;
    a second die pad, which is separated from the first die pad;
    a first semiconductor chip disposed over the first die pad and including the high side transistor, the first driver circuit and the second driver circuit, the first semiconductor chip having a first source electrode pad of the high side transistor and a first drain electrode pad of the high side transistor, the first source electrode pad and the first drain electrode pad facing toward the top surface of the resin body, and the first semiconductor chip having a rectangular shape in plan view, with a pair of long sides and a pair of short sides;
    a second semiconductor chip disposed over the second die pad and including the low side transistor, the second semiconductor chip having a second source electrode pad and a second drain electrode of the low side transistor;
    an input lead exposed from the bottom surface of the resin body and electrically coupled to the first drain electrode pad of the first semiconductor chip;
    a ground potential lead exposed from the bottom surface of the resin body and electrically coupled to the second source electrode pad of the second semiconductor chip;
    an output lead exposed from the bottom surface of the resin body and electrically coupled to the first source electrode pad of the first semiconductor chip and to the second drain electrode of the second semiconductor chip;
    a first metal wirings electrically and mechanically coupled between the first source electrode pad of the first semiconductor chip and the second die pad, the first metal wirings being disposed so as to overlap one of the long sides of the first semiconductor chip in plan view; and
    a second metal wirings electrically and mechanically coupled between the second source electrode pad of the second semiconductor chip and the ground potential lead,
    wherein the one long side of the first semiconductor chip is arranged such that a closest distance between the second semiconductor chip and the one long side of the first semiconductor chip is less than a closest distance between the second semiconductor chip and the other long side of the first semiconductor chip.

2. A semiconductor device according to claim 1, wherein the first source electrode pad has a rectangular shape in plan view, with a pair of long sides and a pair of short sides, and
wherein the long sides of the first semiconductor chip are parallel to the long sides of the first source electrode pad.

3. A semiconductor device according to claim 1, wherein the high side transistor and the low side transistor are N-channel type.

4. A semiconductor device according to claim 1, wherein the high side transistor and the low side transistor are N-channel type MOSFETs.

5. A semiconductor device according to claim 1, wherein the first and second metal wirings are copper.

6. A semiconductor device according to claim 1, wherein the first semiconductor chip further includes:
    a plurality of bonding pads; and
    a plurality of bonding wires coupled to the bonding pads, respectively.

* * * * *